US009460941B2

(12) United States Patent
Nishiyama

(10) Patent No.: US 9,460,941 B2
(45) Date of Patent: Oct. 4, 2016

(54) SUBSTRATE CLEANING APPARATUS AND SUBSTRATE PROCESSING APPARATUS INCLUDING THE SUBSTRATE CLEANING APPARATUS

(71) Applicant: Koji Nishiyama, Kyoto (JP)

(72) Inventor: Koji Nishiyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 744 days.

(21) Appl. No.: 13/721,352

(22) Filed: Dec. 20, 2012

(65) Prior Publication Data

US 2013/0255031 A1   Oct. 3, 2013

(30) Foreign Application Priority Data

Mar. 27, 2012   (JP) ................. 2012-072455

(51) Int. Cl.
*H01L 21/304*   (2006.01)
*H01L 21/67*    (2006.01)
*B01D 46/00*    (2006.01)
*H01L 21/687*   (2006.01)

(52) U.S. Cl.
CPC ....... *H01L 21/6704* (2013.01); *B01D 46/0002* (2013.01); *H01L 21/67046* (2013.01); *H01L 21/67051* (2013.01); *H01L 21/68728* (2013.01); *H01L 21/68742* (2013.01)

(58) Field of Classification Search
CPC ........... H01L 21/67046; H01L 21/67051; H01L 21/6704; H01L 21/02016; H01L 21/02054; H01L 21/0209; H01L 21/02052; H01L 21/67034; B01D 46/0002; B01D 46/001

USPC .......................... 134/902, 137, 151; 438/906
See application file for complete search history.

(56) References Cited

U.S. PATENT DOCUMENTS

| 5,435,075 A * | 7/1995 | Shiraishi ........... H01L 21/67034 34/187 |
| 5,487,768 A * | 1/1996 | Zytka ................. B01D 46/0023 454/187 |
| 5,792,259 A | 8/1998 | Yoshioka et al. ............... 118/52 |
| 7,107,701 B2 * | 9/2006 | Takemura et al. .............. 34/526 |

(Continued)

FOREIGN PATENT DOCUMENTS

| JP | 58-128737 A | 8/1983 |
| JP | 9-148226 | 6/1997 |

(Continued)

OTHER PUBLICATIONS

Machine translation of JP2009164370A, dated Jul. 2009.*

(Continued)

*Primary Examiner* — Michael Barr
*Assistant Examiner* — Kevin G Lee
(74) *Attorney, Agent, or Firm* — Ostrolenk Faber LLP

(57) ABSTRACT

An ULPA filter is arranged at the upper portion in a casing. Air outside of the casing is supplied to the ULPA filter through a duct. Clean air that has passed through the ULPA filter is led to an opening of a spin plate through a passage forming member, a connection member, a base, a motor supporting member and a rotating shaft of a spin motor. The spin chuck holds a substrate such that the upper surface of the substrate is opposite to the spin plate. In this state, the spin motor operates, causing the spin plate to rotate and thus the lower surface of the rotating substrate to be cleaned by a cleaning brush.

7 Claims, 15 Drawing Sheets

(56) References Cited

U.S. PATENT DOCUMENTS

| | | | |
|---|---|---|---|
| 7,712,475 B2* | 5/2010 | Fukuda et al. | 134/94.1 |
| 8,015,985 B2 | 9/2011 | Hamada et al. | 134/99.1 |
| 8,166,985 B2 | 5/2012 | Nishiyama et al. | 134/137 |
| 2004/0194801 A1 | 10/2004 | Verhaverbeke | 134/3 |
| 2008/0083436 A1 | 4/2008 | Verhaverbeke et al. | 134/48 |
| 2009/0073394 A1 | 3/2009 | Miyagi et al. | 355/27 |
| 2009/0305612 A1 | 12/2009 | Miyazaki et al. | 451/11 |
| 2014/0302676 A1 | 10/2014 | Miyazaki et al. | 438/692 |
| 2015/0050863 A1 | 2/2015 | Miyazaki et al. | 451/41 |

FOREIGN PATENT DOCUMENTS

| | | |
|---|---|---|
| JP | 11-204613 | 7/1999 |
| JP | 2002-164314 | 6/2002 |
| JP | 2004-311738 | 11/2004 |
| JP | 2006-019584 | 1/2006 |
| JP | 2009-123800 | 6/2009 |
| JP | 2009-164370 | 7/2009 |
| JP | 2009-218563 | 9/2009 |
| JP | 2009-260033 | 11/2009 |
| TW | 200924096 A | 6/2009 |
| TW | 200933810 A | 8/2009 |
| TW | 201005865 A | 2/2010 |

OTHER PUBLICATIONS

Machine translation of JP 2004-311738 A, dated Nov. 2004.*
Office Action issued Apr. 15, 2015 in corresponding Taiwan Application No. 101150669.
Notice of Reasons for Refusal issued Dec. 22, 2015 in corresponding Japanese Patent Application No. 2012-072455.
Notice of Decision of Refusal dated Aug. 16, 2016 in corresponding Japanese Patent Application No. 2012-072455.

* cited by examiner

F I G. 7
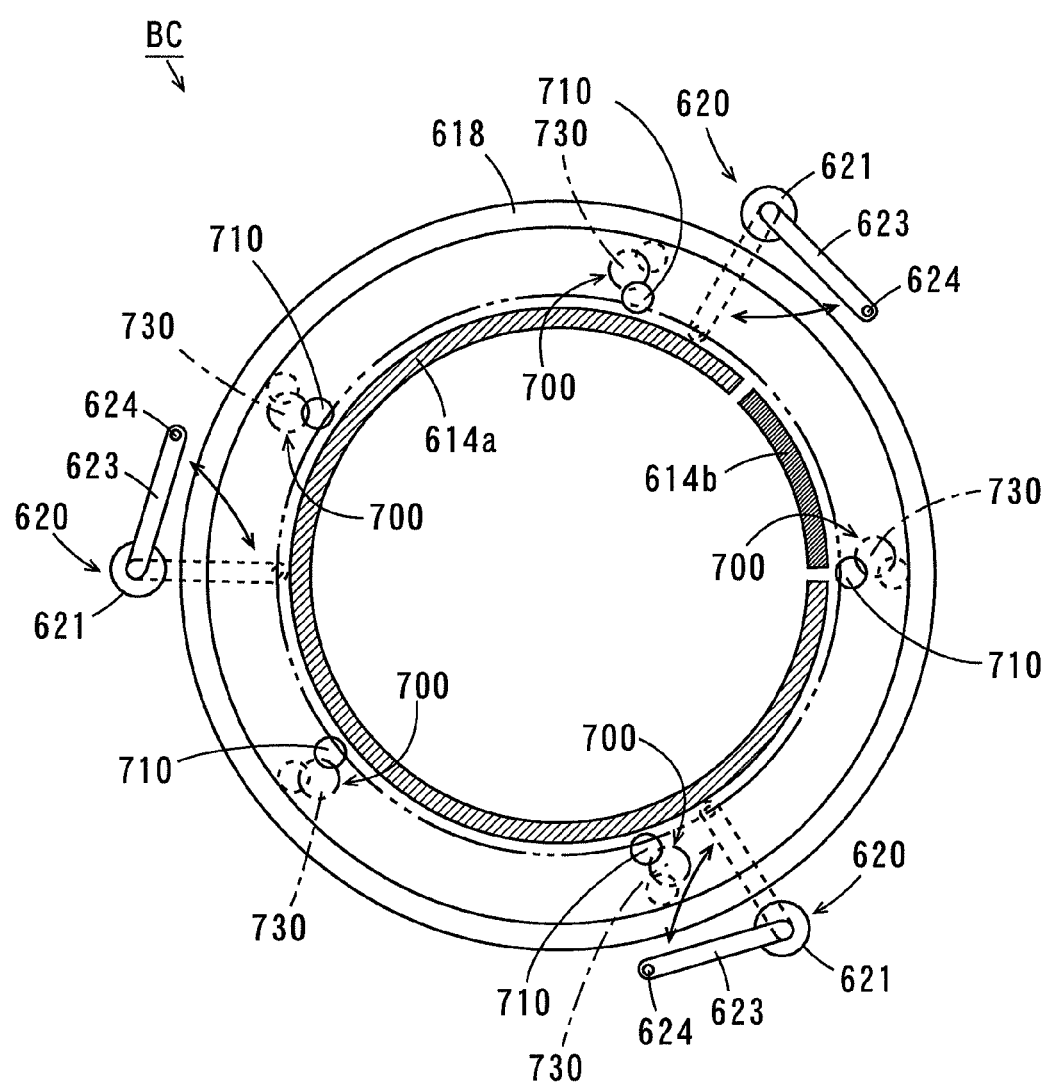

SUBSTRATE CLEANING APPARATUS AND SUBSTRATE PROCESSING APPARATUS INCLUDING THE SUBSTRATE CLEANING APPARATUS

BACKGROUND OF THE INVENTION (1) Field of the Invention

The present invention relates to a substrate cleaning apparatus and a substrate processing apparatus including the substrate cleaning apparatus.

(2) Description of Related Art

Substrate processing apparatuses have been conventionally used to subject substrates such as semiconductor wafers, glass substrates for photomasks, liquid crystal displays, and glass substrates for optical discs to various types of processing.

The substrate processing apparatus as described in JP 2006-019584 A includes a plurality of processing chambers. A fan filter unit is arranged above each processing chamber and an exhaust duct is connected to the lower portion of each processing chamber. The air in a clean room is supplied to each processing chamber through a filter in the fan filter unit and is exhausted through the exhaust duct from the processing chamber. In this case, a downflow of clean air is formed in each processing chamber.

BRIEF SUMMARY OF THE INVENTION

Adherence of a mist (microdroplets) or particles to a substrate, however, may not be prevented sufficiently even when the downflow is formed in each processing chamber.

A cleaning/drying processing unit described in JP 2009-164370 A, for example, includes a spin chuck including a spin plate. The spin plate has a slightly larger disc-shape than the outer shape of a substrate. The spin plate is positioned above the substrate with the substrate being held in a horizontal attitude by the spin chuck. In this case, even though a downflow is formed in the cleaning/drying processing unit, clean air is not supplied to a space between the spin plate and the substrate. Therefore, a mist of a cleaning liquid or particles may enter the space between the spin plate and the substrate and adhere to the upper surface of the substrate at the time of cleaning processing and at the time of scattering drying processing of the substrate.

An object of the present invention is to provide a substrate cleaning apparatus capable of cleaning a lower surface of a substrate while keeping an upper surface of the substrate clean, and a substrate processing apparatus including the substrate cleaning apparatus.

(1) According to an aspect of the present invention, a substrate cleaning apparatus that cleans a lower surface of a substrate includes a rotating member that is provided to be rotatable around a rotation axis extending in a vertical direction and has an opening at the center thereof, a rotation-driving device that is provided on the upper side of the rotating member to rotate the rotating member, a holding member that is provided on the lower side of the rotating member to hold the substrate with an upper surface of the substrate being opposite to the rotating member, an air supplying mechanism that supplies air to a space between the substrate held by the holding member and the rotating member through the opening of the rotating member, and a cleaning mechanism that cleans the lower surface of the substrate held by the holding member, wherein the air supplying mechanism includes a filter, an air supplier that supplies air to the filter and an air passage configured to lead the air that has passed through the filter to the opening of the rotating member.

In the substrate cleaning apparatus, the air supplier supplies the air to the filter. The clean air that has passed through the filter is led to the opening formed in the central portion of the rotating member by the air passage.

The holding member holds the substrate such that the upper surface of the substrate is opposite to the rotating member. Therefore, the clean air that has been led to the opening of the rotating member is supplied towards the center of the substrate held by the holding member. In this state, the rotation-driving device rotates the rotating member around the rotation axis extending in the vertical direction and the lower surface of the rotating substrate is cleaned by the cleaning mechanism.

In this case, a flow of clean air flowing from the center of the substrate towards the outer peripheral edge of the substrate is formed on the upper surface of the substrate. Thus, an atmosphere including droplets of a processing liquid, particles or the like is prevented from flowing into the space between the substrate held by the holding member and the rotating member. As a result, the lower surface of the substrate can be cleaned while the upper surface of the substrate is kept clean.

(2) The substrate cleaning apparatus may further include a casing that stores at least part of the air supplying mechanism, the rotating member, the rotation-driving device, the holding member and the cleaning mechanism, wherein the filter may be arranged at an upper portion in the casing so as to allow the passage of the air supplied by the air supplier from above towards below, the air passage may be configured to lead part of the air that has passed through the filter to the opening of the rotating member, and remaining air that has passed through the filter may be supplied into the casing.

In this case, part of the air that has passed through the filter arranged at the upper portion in the casing is supplied to the space between the substrate held by the holding member and the rotating member. Further, the remaining air that has passed through the filter is supplied from above towards below in the casing.

Therefore, the flow of clean air flowing from the center of the substrate towards the outer peripheral edge of the substrate is formed on the upper surface of the substrate, and the flow of clean air flowing from above towards below is formed in the casing. Thus, scattering of the droplets of the clean liquid and the particles in the casing can be suppressed while the upper surface of the substrate is kept clean.

(3) The air supplying mechanism may include a duct that is provided on the upper side of the filter to lead the air supplied from outside of the casing to the filter.

In this case, the air supplied from outside of the casing can easily pass from above towards below the filter through the duct. Therefore, the flow of clean air flowing from above towards below in the casing can be easily formed using the remaining air that has passed through the filter.

(4) The air passage may be configured to have a cross sectional area reducing gradually from the filter to the opening of the rotating member.

In this case, because the cross sectional area of the air passage reduces gradually from the filter to the opening of the rotating member, the velocity of an air flow passing through the opening of the rotating member can be higher than the velocity of the air flow passing through the filter. Thus, a sufficient amount of air is supplied to the space between the substrate and the rotating member, so that the flow of clean air flowing from the center of the substrate towards the outer peripheral edge of the substrate is reliably formed on the upper surface of the substrate.

(5) The rotation-driving device may have a hollow rotating shaft that constitutes part of the air passage and extends in a vertical direction, and the rotating member may be attached to the lower end of the rotating shaft such that the inner space of the rotating shaft communicates with a space below the rotating member through the opening.

In this case, the clean air that has passed through the filter is supplied to the space between the substrate and the rotating member through the inner space in the rotating shaft with the substrate being held by the holding member. Thus, the rotating shaft of the rotation-driving device forms part of the air passage, whereby the clean air can be led to the opening of the rotating member without a complicated configuration.

(6) The cleaning mechanism may include a cleaning member for cleaning the lower surface of the substrate held by the holding member, and a cleaning liquid supplier that supplies a cleaning liquid to the lower surface of the substrate held by the holding member.

In this case, the cleaning liquid is supplied to the lower surface of the substrate held by the holding member, and the lower surface of the substrate is reliably cleaned by the cleaning member.

The droplets of the cleaning liquid supplied to the substrate scatter in the peripheral space around the substrate at the time of cleaning the lower surface of the substrate. Even in this case, the flow of clean air flowing from the center of the substrate towards the outer peripheral edge of the substrate is formed on the upper surface of the substrate, and therefore the droplets of the cleaning liquid are reliably prevented from adhering to the upper surface of the substrate.

(7) According to another aspect of the present invention, a substrate processing apparatus that is arranged adjacent to an exposure device and subjects a substrate to processing includes a processing section for performing processing on the substrate, and an interface section for receiving and transferring the substrate between the processing section and the exposure device, wherein at least one of the processing section and the interface section includes the substrate cleaning apparatus that cleans a lower surface of the substrate before exposure processing by the exposure device.

In the substrate processing apparatus, the processing section performs predetermined processing on the substrate and the interface section receives and transfers the substrate between the processing section and the exposure device. At least one of the processing section and the interface section includes the substrate cleaning apparatus described above.

In the substrate cleaning apparatus, the lower surface of the substrate can be cleaned while the upper surface of the substrate is kept clean. Thus, a processing defect of the substrate due to contamination on the upper and lower surfaces of the substrate can be prevented.

(8) The processing section may include a photosensitive film formation unit configured to form a photosensitive film made of a photosensitive material on an upper surface of the substrate, and the substrate cleaning apparatus may be configured to clean the lower surface of the substrate after the formation of the photosensitive film by the photosensitive film formation unit, and before or after the exposure processing by the exposure device.

In this case, the lower surface of the substrate is cleaned by the substrate cleaning apparatus after the formation of the photosensitive film by the photosensitive film formation unit, and before or after the exposure processing by the exposure device. The upper surface of the substrate is kept clean at the time of cleaning the substrate by the substrate cleaning apparatus. Thus, the contamination on the photosensitive film formed on the upper surface of the substrate is prevented.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 7 is a schematic plan view showing the configuration of the back surface cleaning processing unit;

DESCRIPTION OF THE PREFERRED EMBODIMENTS

A substrate cleaning apparatus and a substrate processing apparatus including the substrate cleaning apparatus according to an embodiment of the present invention will be described below with reference to the drawings. In the following description, a substrate refers to a semiconductor substrate, a substrate for a liquid crystal display, a substrate for a plasma display, a glass substrate for a photomask, a substrate for an optical disc, a substrate for a magnetic disc, a substrate for a magneto-optical disc, a substrate for a photomask or the like. In the present embodiment, a back surface cleaning processing unit that performs cleaning processing on a back surface of the substrate before exposure processing will be described as one example of the substrate cleaning apparatus.

(1) Configuration of Substrate Processing Apparatus

Figure 1:
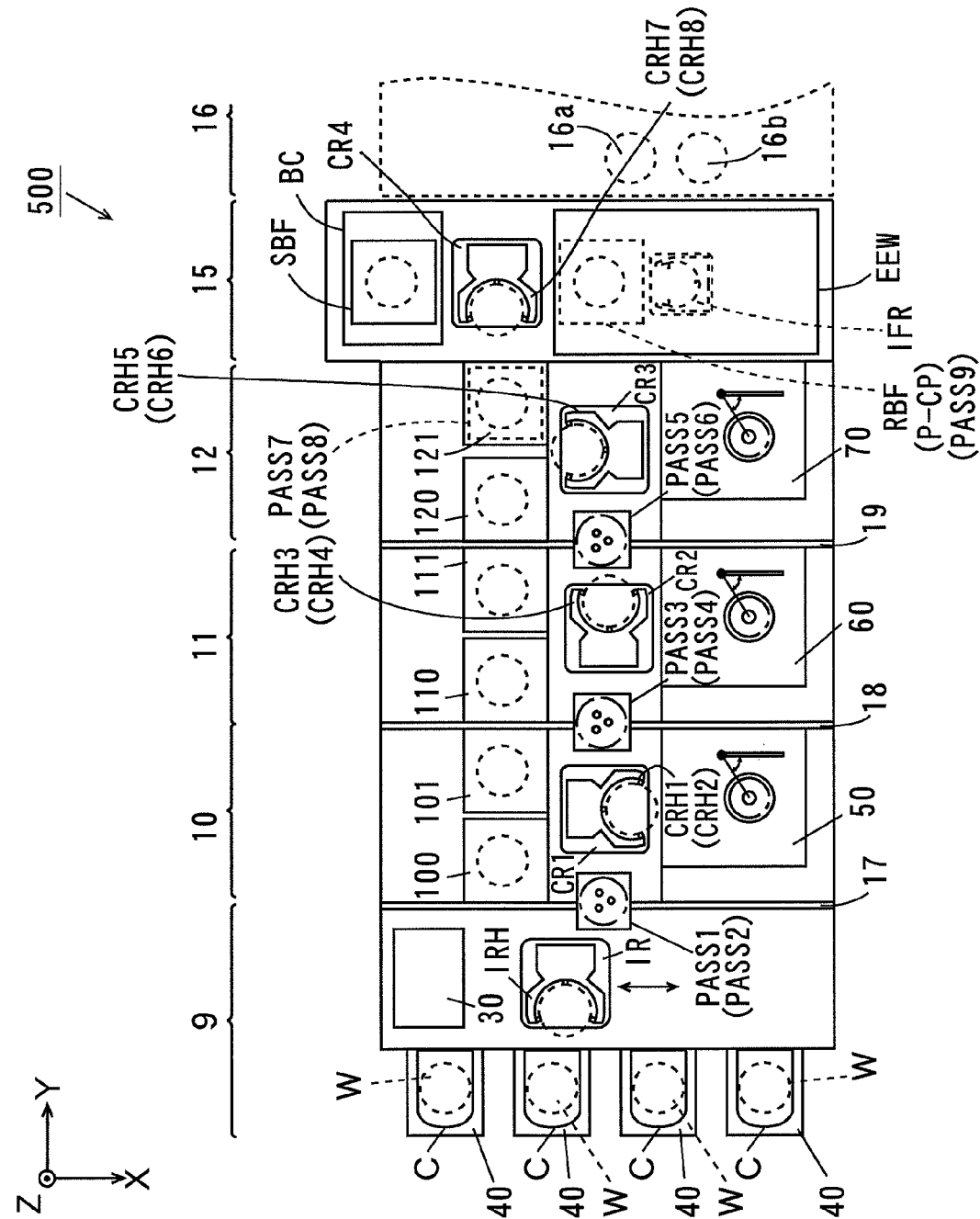
FIG. 1 is a plan view of a substrate processing apparatus according to one embodiment of the present invention.

FIG. 1 is a plan view of the substrate processing apparatus according to one embodiment of the present invention. A substrate processing apparatus 500 according to the present embodiment is installed in a clean room, for example. FIG. 1 and FIGS. 2 to 4 described below are accompanied by the arrows that indicate X, Y, and Z directions orthogonal to one another for the clarity of a positional relationship. The X and Y directions are orthogonal to each other within a horizontal plane and the Z direction corresponds to a vertical direction.

As shown in FIG. 1, the substrate processing apparatus 500 includes an indexer block 9, an anti-reflection film processing block 10, a resist film processing block 11, a development processing block 12 and an interface block 15. An exposure device 16 is arranged adjacent to the interface block 15. The exposure device 16 subjects a substrate W to the exposure processing.

The indexer block 9 includes a main controller (controller) 30, a plurality of carrier platforms 40, and an indexer robot IR. The main controller 30 controls the operation of the indexer block 9, the anti-reflection film processing block 10, the resist film processing block 11, the development processing block 12, and the interface block 15. The indexer robot IR has a hand IRH provided for receiving and transferring the substrate W.

The anti-reflection film processing block 10 includes thermal processing sections 100, 101 for anti-reflection film, a coating processing section 50 for anti-reflection film and a first central robot CR1. The coating processing section 50 is opposite to the thermal processing sections 100, 101 with the first central robot CR1 sandwiched therebetween. The first central robot CR1 has hands CRH1, CRH2 provided one above the other for receiving and transferring the substrate W.

A partition wall 17 for shielding an atmosphere is provided between the indexer block 9 and the anti-reflection film processing block 10. The partition wall 17 has substrate platforms PASS1, PASS2 provided in the vicinity of one above the other for receiving and transferring the substrate W between the indexer block 9 and the anti-reflection film processing block 10. The upper substrate platform PASS1 is used in transporting the substrate W from the indexer block 9 to the anti-reflection film processing block 10, and the lower substrate platform PASS2 is used in transporting the substrate W from the anti-reflection film processing block 10 to the indexer block 9.

Each of the substrate platforms PASS1, PASS2 is provided with an optical sensor (not shown) that detects presence or absence of the substrate W. This allows determination whether or not the substrate W is placed on the substrate platforms PASS1, PASS2. Furthermore, each of the substrate platforms PASS1, PASS2 has a plurality of support pins secured thereto. Note that each of substrate platforms PASS3 to PASS9 described below is similarly provided with the optical sensor and the support pins.

The resist film processing block 11 includes thermal processing sections 110, 111 for resist film, a coating processing section 60 for resist film and a second central robot CR2. The coating processing section 60 is opposite to the thermal processing sections 110, 111 with the second central robot CR2 sandwiched therebetween. The second central robot CR2 has hands CRH3, CRH4 provided one above the other for receiving and transferring the substrate W.

A partition wall 18 for shielding the atmosphere is provided between the anti-reflection film processing block 10 and the resist film processing block 11. The partition wall 18 has substrate platforms PASS3, PASS4 provided in the vicinity of one above the other for receiving and transferring the substrate W between the anti-reflection film processing block 10 and the resist film processing block 11. The upper substrate platform PASS3 is used in transporting the substrate W from the anti-reflection film processing block 10 to the resist film processing block 11, and the lower substrate platform PASS4 is used in transporting the substrates W from the resist film processing block 11 to the anti-reflection film processing block 10.

The development processing block 12 includes a thermal processing section 120 for development, a thermal processing section 121 for post-exposure bake, a development processing section 70, and a third central robot CR3. The thermal processing section 121, adjacent to the interface block 15, has substrate platforms PASS7, PASS8 as described below. The development processing section 70 is opposite to the thermal processing section 120 and the thermal processing section 121 with the third central robot CR3 sandwiched therebetween. The third central robot CR3 has hands CRH5, CRH6 provided one above the other for receiving and transferring the substrate W.

A partition wall 19 for shielding the atmosphere is provided between the resist film processing block 11 and the development processing block 12. The partition wall 19 has substrate platforms PASS5, PASS6 provided in the vicinity of one above the other for receiving and transferring the substrate W between the resist film processing block 11 and the development processing block 12. The upper substrate platform PASS5 is used in transporting the substrates W from the resist film processing block 11 to the development processing block 12, and the lower substrate platform PASS6 is used in transporting the substrate W from the development processing block 12 to the resist film processing block 11.

The interface block 15 includes a sending buffer unit SBF, back surface cleaning processing units BC, a fourth central robot CR4, an edge exposure unit EEW, a return buffer unit RBF, placement/cooling units PASS-CP (hereinafter abbreviated as P-CP), a substrate platform PASS9 and an interface transport mechanism IFR.

Each back surface cleaning processing unit BC subjects a back surface of the substrate W before the exposure processing to cleaning processing (hereinafter referred to as back surface cleaning processing). Here, the surface of the substrate W directed upward is referred to as an upper surface of the substrate W, and the surface of the substrate directed downward is referred to as a lower surface of the substrate W. Note that the main surface of the substrate W is referred to as a surface, on which an anti-reflection film and a resist film are formed in the anti-reflection film processing block 10 and the resist film processing block 11, and the back surface of the substrate W is referred to as a surface on the opposite side thereof. Inside of the substrate processing apparatus 500 according to the present embodiment, the substrate W is subjected to various processing with the main surface thereof directed upward.

The back surface cleaning processing unit BC includes an edge holding type spin chuck 600 (FIG. 5, described below) that holds an outer peripheral edge of the substrate. The spin chuck 600 includes a spin plate 520 (FIG. 5, described below) having an opening 520$h$ formed in the center portion thereof. The spin chuck 600 holds the substrate W such that the upper surface of the substrate W (the main surface of the substrates W in this example) is opposite to the spin plate 520. In this state, air that has passed through an ULPA (Ultra Low Penetration Air) filter F (FIG. 5, described below) is supplied to the space between the substrate W and the spin plate 520 from the opening 520h of the spin plate 520 and thus, the lower surface of the substrate W (the back surface of the substrate W in this example) is cleaned. The details of the back surface cleaning processing unit BC will be described below.

The fourth central robot CR4 has hands CRH7, CRH8 (FIG. 4) provided one above the other for receiving and transferring the substrate W, and the interface transport mechanism IFR has hands H1, H2 (FIG. 4) provided one above the other for receiving and transferring the substrate W. The details of the interface block 15 will be described below.

In the substrate processing apparatus 500 according to the present embodiment, the indexer block 9, the anti-reflection film processing block 10, the resist film processing block 11, the development processing block 12, and the interface block 15 are arranged in this order in the Y direction.

Figure 2:
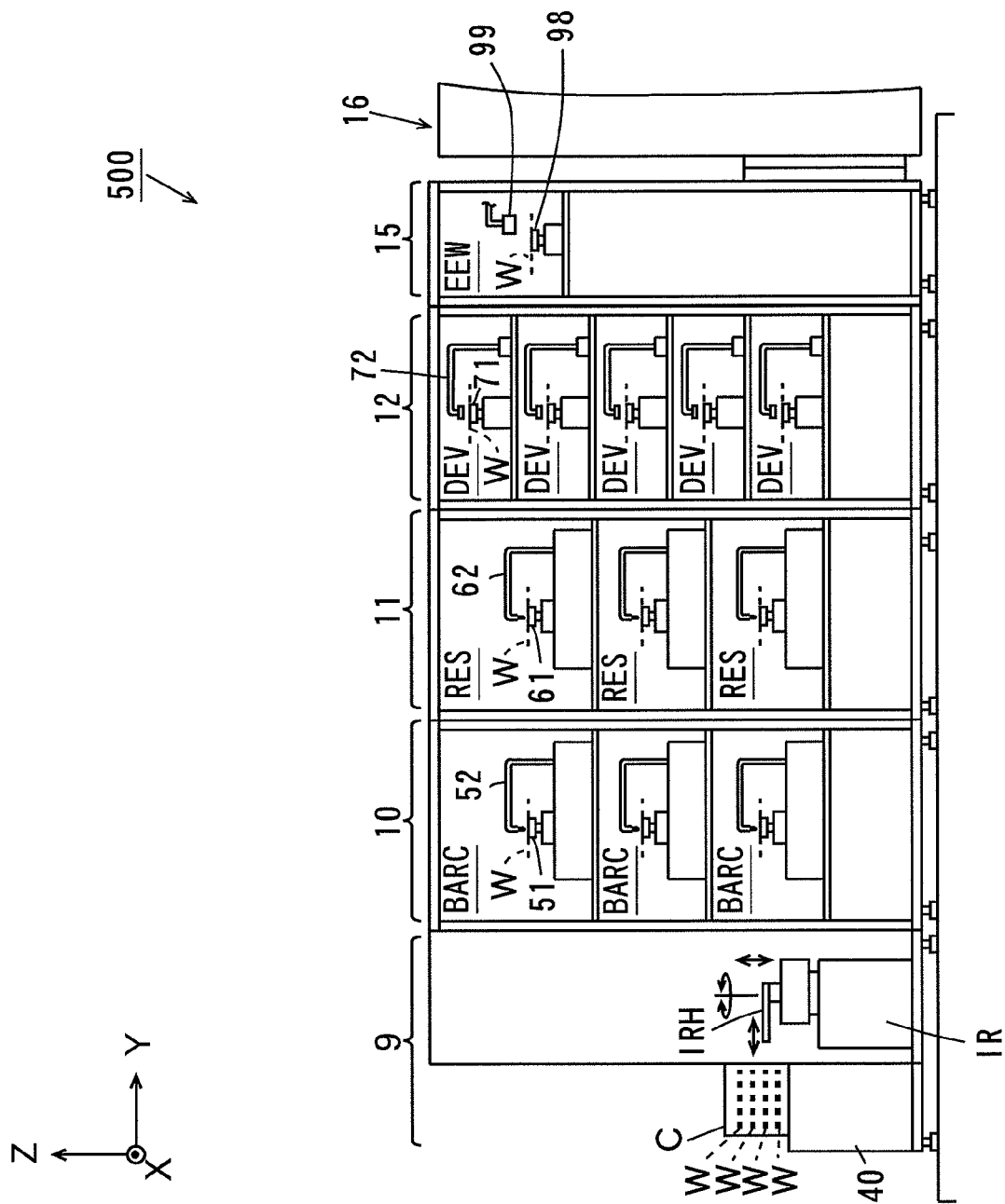
FIG. 2 is a schematic side view of one side of the substrate processing apparatus of FIG. 1.
Figure 3:
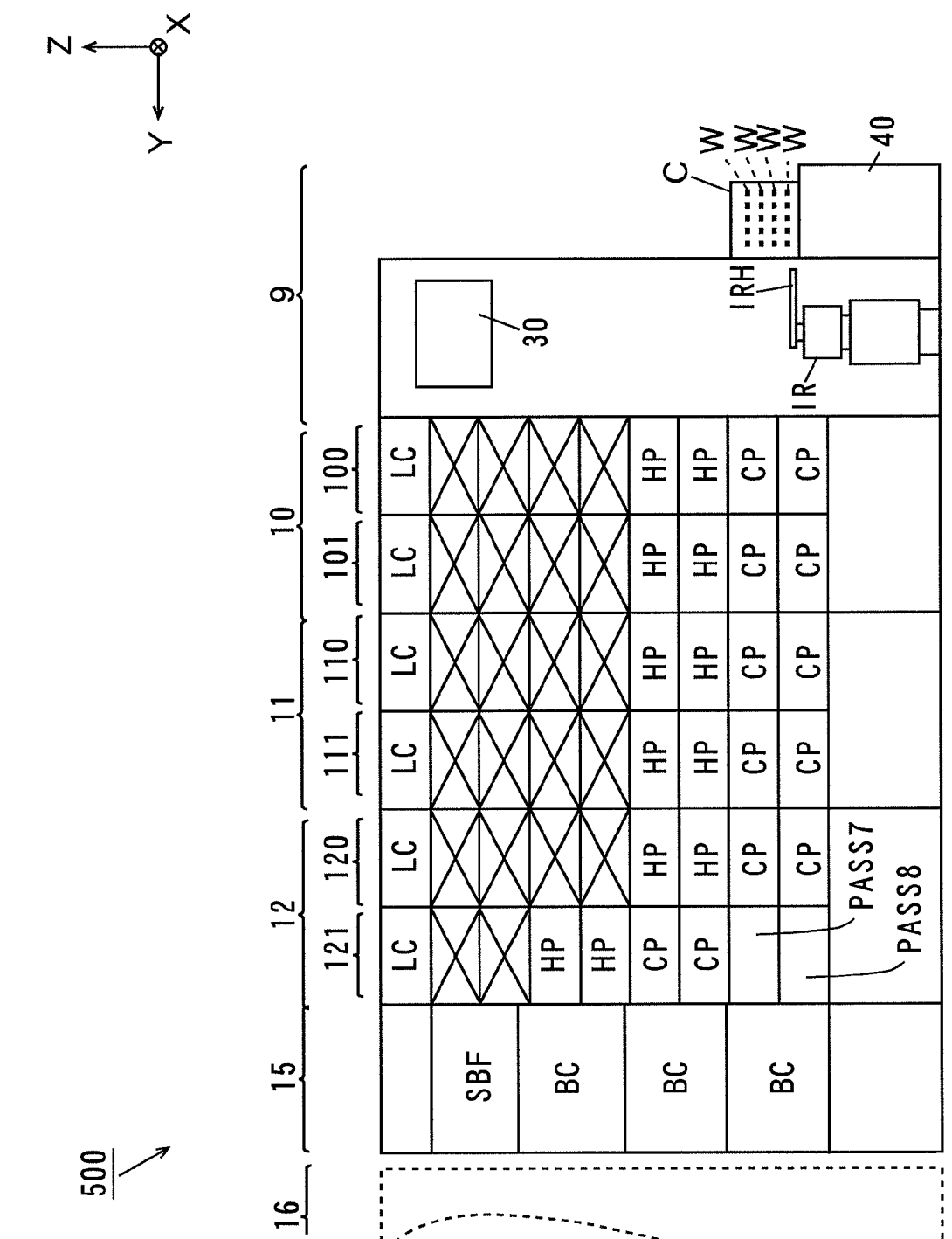
FIG. 3 is a schematic side view of the other side of the substrate processing apparatus of FIG. 1.

FIG. 2 is a schematic side view of one side of the substrate processing apparatus 500 of FIG. 1, and FIG. 3 is a schematic side view of the other side of the substrate processing apparatus 500 of FIG. 1. FIG. 2 mainly shows the configuration provided on the one side of the substrate processing apparatus 500, and FIG. 3 mainly shows the configuration provided on the other side of the substrate processing apparatus 500.

First, the configuration of the substrate processing apparatus 500 will be described using FIG. 2. As shown in FIG. 2, the coating processing section 50 in the anti-reflection film processing block 10 (FIG. 1) has a vertical stack of three coating units BARC. Each coating unit BARC includes a spin chuck 51 that rotates while holding the substrate W in a horizontal attitude by suction and a supply nozzle 52 that supplies a coating liquid for an anti-reflection film to the substrate W held on the spin chuck 51.

The coating processing section 60 in the resist film processing block 11 (FIG. 1) has the vertical stack of three coating units RES. Each coating unit RES includes a spin chuck 61 that rotates while holding the substrate W in a horizontal attitude by suction, and a supply nozzle 62 that supplies the coating liquid for a resist film to the substrate W held on the spin chuck 61.

The development processing section 70 in the development processing block 12 (FIG. 1) has the vertical stack of five development processing units DEV. Each development processing unit DEV includes a spin chuck 71 that rotates while holding the substrate W in the horizontal attitude by suction and a supply nozzle 72 that supplies a development liquid to the substrate W held on the spin chuck 71.

The interface block 15 has the edge exposure unit EEW arranged on the one side. The edge exposure unit EEW includes a spin chuck 98 that rotates while holding the substrate in the horizontal attitude by suction and a light irradiator 99 that exposes a periphery of the substrate W held on the spin chuck 98.

Next, the configuration of the substrate processing apparatus 500 will be described using FIG. 3. As shown in FIG. 3, each of the thermal processing sections 100, 101 in the anti-reflection film processing block 10 has the vertical stack of two heating units (hot plates) HP and two cooling units (cooling plates) CP. Each of the thermal processing sections 100, 101 has a local controller LC that is arranged in its upper most portion and controls the respective temperatures of the heating units HP and the cooling units CP.

Each of the thermal processing sections 110, 111 in the resist film processing block 11 has the vertical stack of the two heating units HP and the two cooling units CP. Each of the thermal processing sections 110, 111 has the local controller LC that is arranged in its uppermost portion and controls the respective temperatures of the heating units HP and the cooling units CP.

The thermal processing section 120 in the development processing block 12 has the vertical stack of the two heating units HP and the two cooling units CP, and the thermal processing section 121 has the vertical stack of the two heating units HP, the two cooling units CP and the substrate platforms PASS7, PASS8. Each of the thermal processing section 120 and the thermal processing section 121 has the local controller LC that is arranged in its uppermost portion and controls the respective temperatures of the heating units HP and the cooling units CP.

Figure 4:
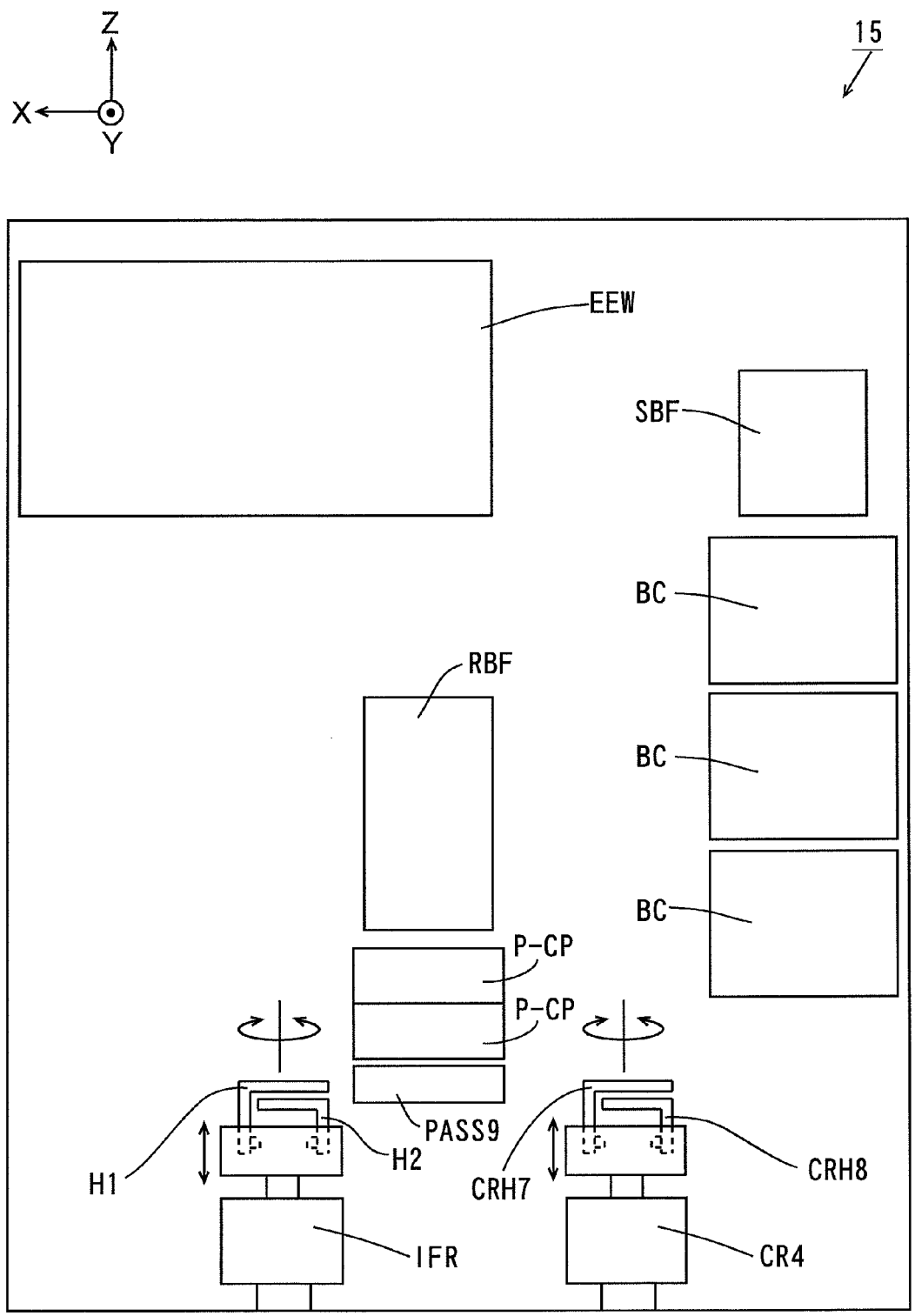
FIG. 4 is a schematic side view of an interface block as viewed from an exposure device of FIG. 1.

The interface block 15 will be then described in detail using FIG. 4. FIG. 4 is a schematic side view of the interface block 15 as viewed from the exposure device 16 of FIG. 1. As shown in FIG. 4, the interface block 15 has the vertical stack of the sending buffer unit SBF and the three back surface cleaning processing units BC on the one side. The interface block 15 has the edge exposure unit EEW arranged on the other side in its upper portion.

The interface block 15 has the vertical stack of the return buffer unit RBF, the two placement/cooling units P-CP, and the substrate platform PASS9 at its substantially central portion below the edge exposure unit EEW.

The fourth central robot CR4 and the interface transport mechanism IFR are provided in the lower portion of the interface block 15. The fourth central robot CR4 is provided to be vertically movable and rotatable in an area among the sending buffer unit SBF, the back surface cleaning processing units BC, the edge exposure unit EEW, the return buffer unit RBF, the placement/cooling units P-CP, and the substrate platform PASS9. The interface transport mechanism IFR is provided to be vertically movable and rotatable in an area among the return buffer unit RBF, the placement/cooling units P-CP, and the substrate platform PASS9.

(2) Operation of Substrate Processing Apparatus

The operation of the substrate processing apparatus 500 according to the present embodiment will be then described with reference to FIGS. 1 to 4.

(2-1) Operation from Indexer Block to Development Processing Block

First, the operation from the indexer block 9 to the development processing block 12 will be briefly described.

Carriers C that store a plurality of substrates W in multiple stages are carried onto the carrier platforms 40 in the indexer block 9. The indexer robot IR takes out any one of unprocessed substrates W that is stored in any one of the carriers C using the hand IRH. Thereafter, the indexer robot IR rotates around the shaft parallel with the Z direction while moving in the X direction, to place the unprocessed substrate W on the substrate platform PASS1.

The unprocessed substrate W placed on the substrate platform PASS1 is received by the first central robot CR1 in the anti-reflection film processing block 10. The first central robot CR1 carries the substrate W into one of the thermal processing sections 100, 101.

Thereafter, the first central robot CR1 takes out the thermally processed substrate W from one of the thermal processing sections 100, 101 and carries the substrate W into the coating processing section 50. In the coating processing section 50, one of coating units BARC forms a coating of an anti-reflection film on the substrate W in order to reduce a standing wave and halation generated during the exposure processing.

The first central robot CR1 then takes out the substrate W after the coating processing from the coating processing section 50 and carries the substrate W into one of the thermal processing sections 100, 101. Thereafter, the first central robot CR1 takes out the thermally processed substrate W from one of the thermal processing sections 100, 101 and places the substrate W on the substrate platform PASS3.

The substrate W placed on the substrate platform PASS3 is received by the second central robot CR2 in the resist film processing block 11. The second central robot CR2 carries the substrate W into one of the thermal processing sections 110, 111.

Thereafter, the second central robot CR2 takes out the thermally processed substrate W from one of the thermal processing sections 110, 111 and carries the substrate W into the coating processing section 60. In the coating processing section 60, any one of the coating units RES forms a coating of the resist film on the substrate W that has been coated with the anti-reflection film.

The second central robot CR2 then takes out the substrate W after the coating processing from the coating processing section 60 and carries the substrate W into one of the thermal processing sections 110, 111. Thereafter, the second central robot CR2 takes out the thermally processed substrate W from one of the thermal processing sections 110, 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the interface block 15 and is subjected to predetermined processing in the interface block 15 and the exposure device 16, as described below. After the predetermined processing is performed in the interface block 15 and the exposure device 16, the fourth central robot CR4 carries the substrate W into the thermal processing section 121 in the development processing block 12.

In the thermal processing section 121, the substrate W is subjected to a post-exposure bake (PEB). Thereafter, the fourth central robot CR4 takes out the substrate W from the thermal processing section 121 and places the substrate W on the substrate platform PASS8.

The substrate W placed on the substrate platform PASS8 is received by the third central robot CR3 in the development processing block 12. The third central robot CR3 carries the substrate W into the development processing section 70. In the development processing section 70, the exposed substrate W is subjected to development processing.

The third central robot CR3 then takes out the substrate W after the development processing from the development processing section 70 and carries the substrate W into the thermal processing section 120. Thereafter, the third central robot CR3 takes out the thermally processed substrate W from the thermal processing section 120 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described.

As described above, the substrate W carried into the indexer block 9 is subjected to predetermined processing and is then placed on the substrate platform PASS7 in the development processing block 12 (FIG. 1).

The substrate W placed on the substrate platform PASS7 is received by the fourth central robot CR4 in the interface block 15. The fourth central robot CR4 carries the substrate W into the edge exposure unit EEW (FIG. 4). In the edge exposure unit EEW, a periphery of the substrate W is subjected to the exposure processing.

The fourth central robot CR4 then takes out the substrate W after the exposure processing from the edge exposure unit EEW and carries the substrate W into any one of the back surface cleaning processing units BC. As described above, in the back surface cleaning processing unit BC, the substrate W before the exposure processing is subjected to the back surface cleaning processing.

A time period for the exposure processing by the exposure device 16 is normally longer than the time period for another processing step and transporting step. As a result, the exposure device 16 cannot accept the subsequent substrates W in many cases. In this case, the substrate W is temporarily stored in the sending buffer unit SBF (FIG. 4). In the present embodiment, the fourth central robot CR4 takes out the substrate W after the back surface cleaning processing from the back surface cleaning processing unit BC and transports the substrate W to the sending buffer unit SBF.

The fourth central robot CR4 then takes out the substrate W stored in the sending buffer unit SBF and carries the substrate W into any one of the placement/cooling units P-CP. The substrate W carried into any one of the placement/cooling units P-CP is kept at the same temperature (23° C., for example) as the temperature in the exposure device 16.

In a case where the exposure device 16 has sufficient processing speed, the substrate W does not have to be stored in the sending buffer unit SBF, but may be transported to the placement/cooling unit P-CP from the back surface cleaning processing unit BC.

The substrate W kept at the above-mentioned predetermined temperature in the placement/cooling unit P-CP is then received by the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) by the interface transport mechanism IFR. The interface transport mechanism IFR places the substrate W on the substrate platform PASS9.

The substrate W placed on the substrate platform PASS9 is received by the fourth central robot CR4. The fourth central robot CR4 carries the substrate W into the thermal processing section 121 in the development processing block 12 (FIG. 1).

Note that when the development processing block 12 cannot temporarily receive the substrate W due to a failure or the like in the development processing units DEV (FIG. 2), the substrate W after the exposure processing can be temporarily stored in the return buffer unit RBF.

(3) Back Surface Cleaning Processing Unit

Figure 5:
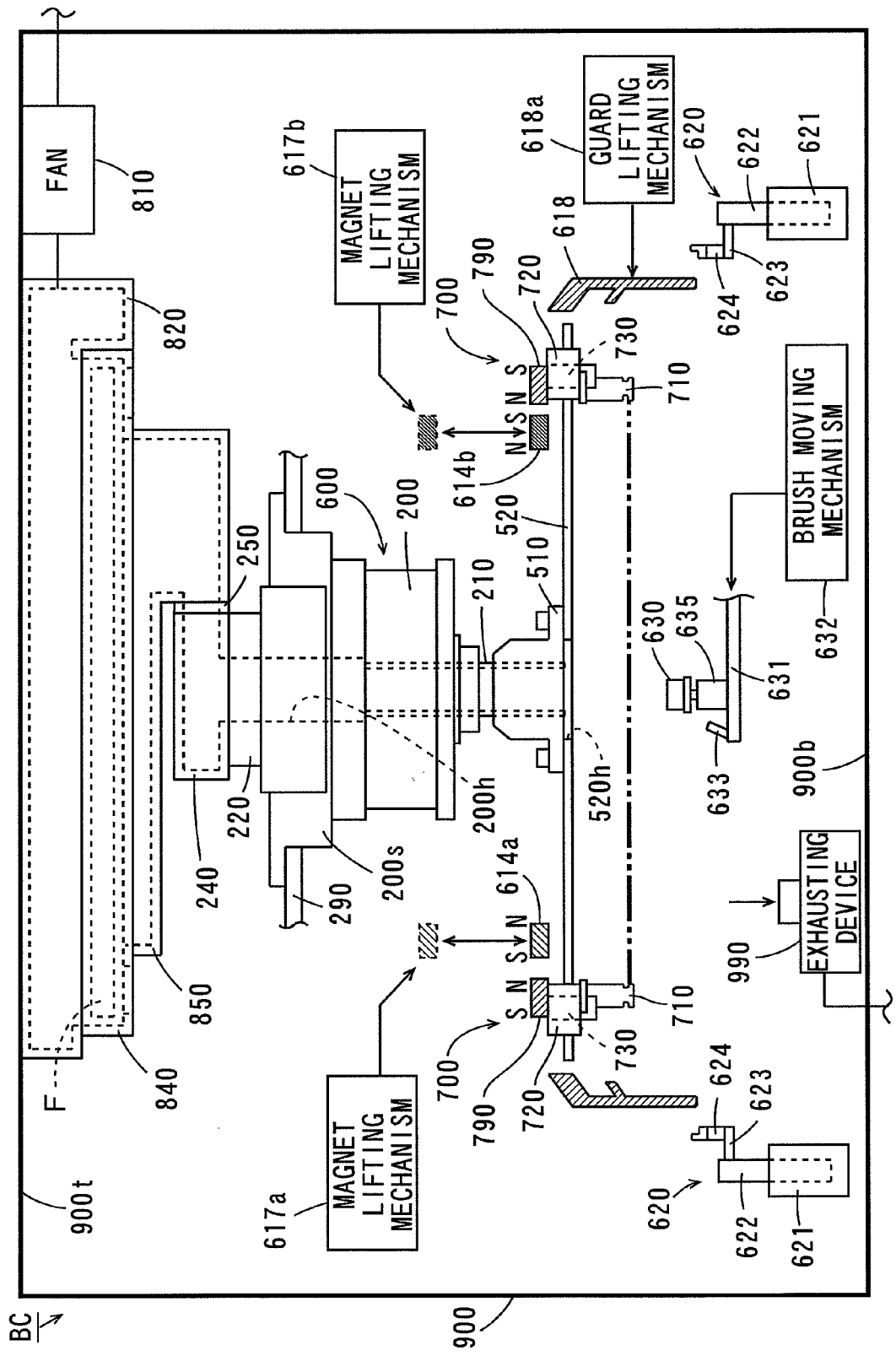
FIG. 5 is a side view showing the configuration of a back surface cleaning processing unit.

The back surface cleaning processing unit BC will be then described in detail with reference to the drawings. FIG. 5 is a side view showing the configuration of the back surface cleaning processing unit BC. The back surface cleaning processing unit BC includes a casing 900 having a substantially rectangular parallelepiped shape, and the following constituent elements are provided inside of the casing 900.

As shown in FIG. 5, the back surface cleaning processing unit BC includes a spin chuck 600 that horizontally holds and rotates the substrate W. The spin chuck 600 includes a spin motor 200, a rotating shaft 210, a disc-shaped spin plate 520, a plate supporting member 510, magnet plates 614a, 614b, and a plurality of substrate holding mechanisms 700.

The spin motor 200 is provided in the upper portion of the back surface cleaning processing unit BC. The spin motor 200 is supported by a motor supporting member 200s. The motor supporting member 200s is attached to a motor fixing member 290. The motor fixing member 290 is fixed to the casing 900 of the back surface cleaning processing unit BC.

A through hole 200h extending in a vertical direction is formed in the motor supporting member 200s. A base 220 having an annular shape is attached to the upper portion of the motor supporting member 200s. Further, a box-shaped connection member 240 having an inner space is attached to the upper portion of the base 220.

A fan 810, a duct 820, a filter storing member 840, and a passage forming member 850 are attached to a ceiling 900t and its vicinity of the casing 900 of the back surface cleaning processing unit BC. As described below, the ULPA filter F is stored in the filter storing member 840. The connection member 240 is connected to the passage forming member 850 with a packing 250 sandwiched therebetween. The details of the fan 810, the duct 820, the filter storing member 840, and the passage forming member 850 will be described below.

The hollow rotating shaft 210 is provided to extend downwardly from the inside of the spin motor 200. The rotating shaft 210 functions as an output shaft of the spin motor 200. The inner space of the rotating shaft 210 communicates with the through hole 200h formed in the motor supporting member 200s, the inner space of the base 220 and the inner space of the connection member 240.

Figure 6:
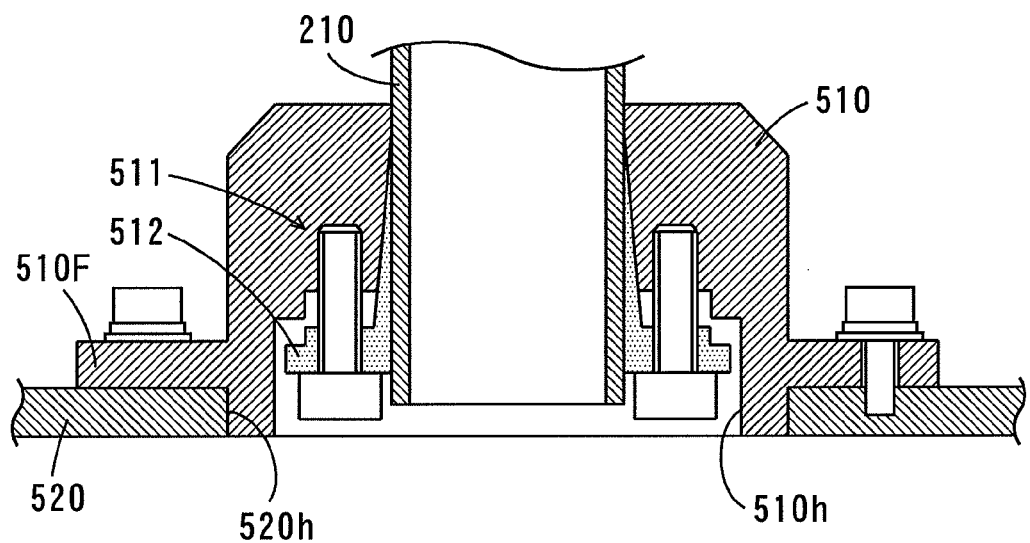
FIG. 6 is an enlarged vertical view mainly showing the configuration of the lower end of a rotating shaft and a plate supporting member of FIG. 5.

FIG. 6 is an enlarged vertical sectional view mainly showing the configuration of the lower end of the rotating shaft 210 and the plate supporting member 510 of FIG. 5. As shown in FIG. 6, the plate supporting member 510 having a substantially cylindrical shape is attached to the lower end of the rotating shaft 210. The plate supporting member 510 has an inner peripheral surface 510h that has a diameter decreasing from the lower end towards the upper end in a stepped shape.

A pad fixing piece 512 having a cylindrical shape is fitted in a gap between the inner peripheral surface 510h of the plate supporting member 510 and an outer peripheral surface of the rotating shaft 210, and the pad fixing piece 512 is screwed into a screw receiver 511 in the plate supporting member 510. This causes the plate supporting member 510 to be fixed to the lower end of the rotating shaft 210.

A flange 510F is formed in the vicinity of the lower end of the plate supporting member 510. The flange 510F and the spin plate 520 are screwed into each other, so that the spin plate 520 is fixed to the plate supporting member 510 in a horizontal attitude. The rotating shaft 210 of the spin motor 200 rotates, causing the plate supporting member 510 together with the spin plate 520 to rotate around a vertical axis. The spin plate 520 has a circular-shaped opening 520h formed at its center.

The fan 810 operates to cause the air outside of the substrate processing apparatus 500 to be supplied to the ULPA filter F stored in the filter storing member 840 through the duct 820. Thereafter, the air that has passed through the ULPA filter F is led to the opening 520h formed in the spin plate 520 through the passage forming member 850, the connection member 240, the base 220, the motor supporting member 200s and the rotating shaft 210 of the spin motor 200 and is supplied to a space below the spin plate 520.

Thus, in this example, the fan 810, the duct 820, the passage forming member 850, the connection member 240, the base 220, the motor supporting member 200s and the rotating shaft 210 of the spin motor 200 function as an air supplying mechanism that supplies clean air to the space below the spin plate 520 through the opening 520h formed in the spin plate 520.

An exhausting device 990 is provided on the bottom surface 900b of the casing 900 of the back surface cleaning processing unit BC in order to exhaust the atmosphere inside of the casing 900 of the back surface cleaning processing unit BC to an exhausting equipment of a factory.

FIG. 7 is a schematic plan view showing the configuration of part of the back surface cleaning processing unit BC. As shown in FIG. 7, the plurality of (five in this example) substrate holding mechanisms 700 are spaced in a periphery of the spin plate 520 equiangularly about the rotating shaft 210. The number of the substrate holding mechanisms 700 is desirably not less than five. The reason for this will be described below.

As shown in FIGS. 5 and 7, each substrate holding mechanism 700 is mainly composed of a holding pin 710, a supporter 720, a shaft 730 and a magnet 790. The spin plate 520 is provided with the supporter 720. The shaft 730 is supported to be rotatable inside of the supporter 720. The substantially columnar-shaped holding pin 710 is attached to the lower end of the shaft 730. The magnet 790 is attached to the upper end of the shaft 730.

Each substrate holding mechanism 700 is switchable between a closed state where the holding pin 710 abuts against the outer peripheral edge of the substrate W and an opened state where the holding pin 710 is spaced apart from the outer peripheral edge of the substrate W. Note that each substrate holding mechanism 700 enters the closed state when the N pole of the magnet 790 is on the inner side, while the substrate holding mechanism enters the opened state when the S pole of the magnet 790 is on the inner side in this example. The supporters 720 and the magnets 790 are not shown in FIG. 7 in order to clarify the positional relationship between the holding pins 710 and the shafts 730 in the substrate holding mechanisms 700.

The magnet plates 614a, 614b are arranged above the spin plate 520 in the circumference direction with the rotating shaft 210 as its center. Each of the magnet plates 614a, 614b has the S pole and the N pole, respectively, on the outer side and the inner side. The magnet plates 614a, 614b are independently lifted and lowered, respectively, by magnet lifting/lowering mechanisms 617a, 617b, and move between an upper position higher than the magnets 790 of the substrate holding mechanisms 700 and a lower position substantially equal in height to the magnets 790 of the substrate holding mechanisms 700.

Each substrate holding mechanism 700 is switchable between the opened state and the closed state by lifting and lowering the magnet plates 614a, 614b. The details of the operation of the magnet plates 614*a*, 614*b* and the substrate holding mechanism 700 will be described below.

A guard 618 for receiving a cleaning liquid scattered from the substrate W at the time of the back surface cleaning processing of the substrate W is provided outside of the spin chuck 600. The guard 618 is shaped to be rotationally-symmetric with respect to the rotating shaft 210 of the spin chuck 600. Further, the guard 618 is lifted and lowered by a guard lifting/lowering mechanism 618*a*. The cleaning liquid received by the guard 618 is discharged or recovered by a liquid discharge device or a recovery device (not shown).

Outside of the guard 618, three or more (three in this example) substrate interface mechanisms 620 are equiangularly arranged with the rotating shaft 210 of the spin chuck 600 as a center. Each substrate interface mechanism 620 includes a lifting/lowering/rotating driver 621, a rotating shaft 622, an arm 623, and a holding pin 624. The rotating shaft 622 is provided to extend upward from the lifting/lowering/rotating driver 621, and the arm 623 is connected to extend in the horizontal direction from the upper end of the rotating shaft 622. The holding pin 624 for holding the outer peripheral edge of the substrate W is provided at the tip of the arm 623.

The lifting/lowering/rotating driver 621 causes the rotating shaft 622 to perform a lifting/lowering operation and a rotating operation. Thus, the holding pin 624 moves in the horizontal direction and the vertical direction.

Furthermore, as shown in FIG. 5, a substantially columnar-shaped cleaning brush 630 is arranged in the lower portion of the back surface cleaning processing unit BC. The cleaning brush 630 is attached to the upper end of the support shaft 635. The lower end of the support shaft 635 is attached to a brush holding member 631. The brush holding member 631 is driven by a brush moving mechanism 632, and therefore the cleaning brush 630 moves in the horizontal direction and in the vertical direction.

A cleaning nozzle 633 is attached to a portion, in the vicinity of to the cleaning brush 630, of the brush holding member 631. A liquid supply pipe (not shown) to which the cleaning liquid is supplied is connected to the cleaning nozzle 633. A discharge port of the cleaning nozzle 633 is directed towards the periphery of the cleaning brush 630, and the cleaning liquid is discharged towards the periphery of the cleaning brush 630 from the discharge port. In this example, an example of the cleaning liquid is pure water.

(4) Detailed Configuration for Leading Air to Opening of Spin Plate

Figure 8:
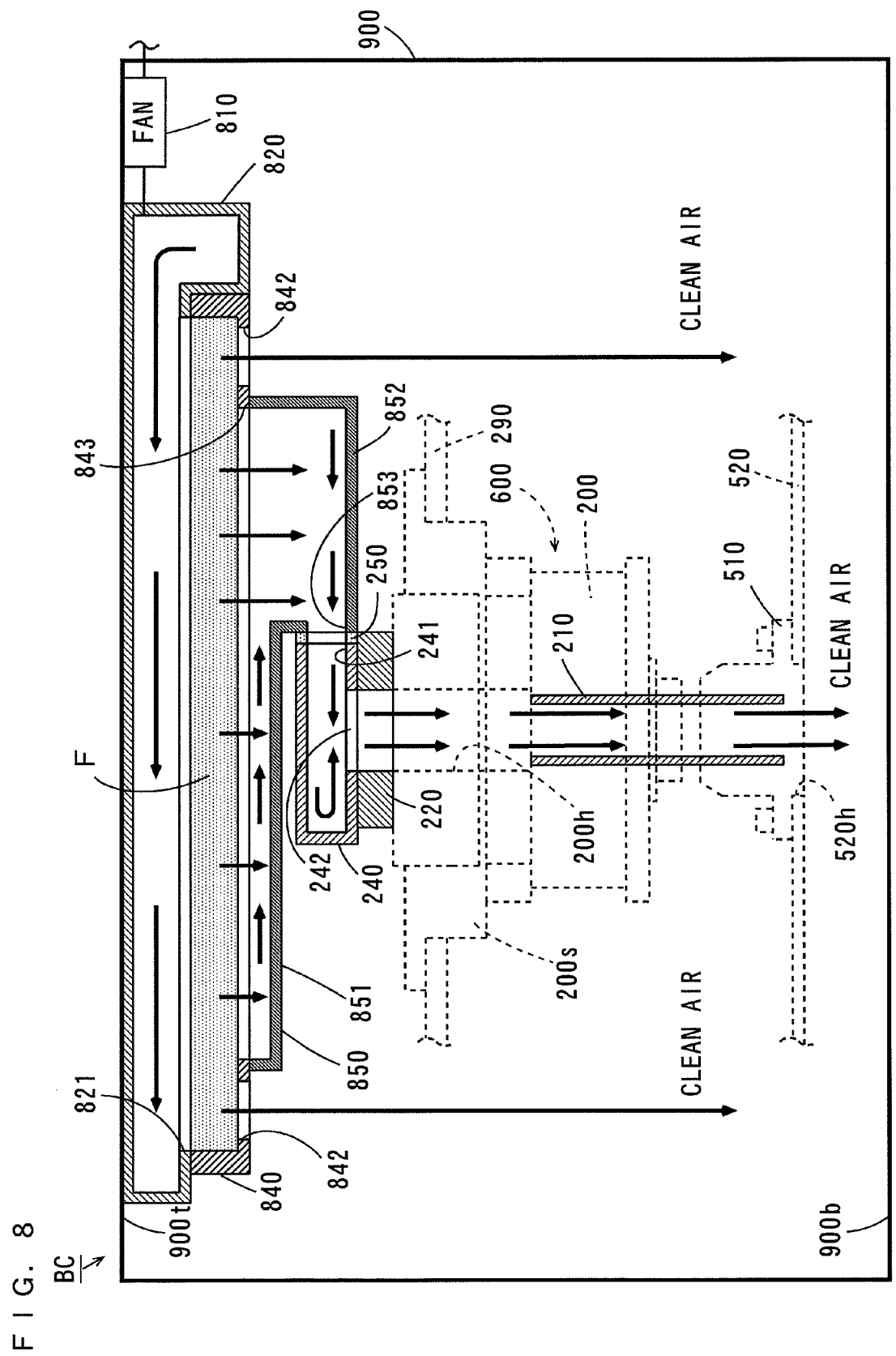
FIG. 8 is a vertical sectional view mainly showing the configuration of a rotating shaft, a base, a connection member, a duct, a filter storing member, and a passage forming member of FIG. 5.
Figure 9:
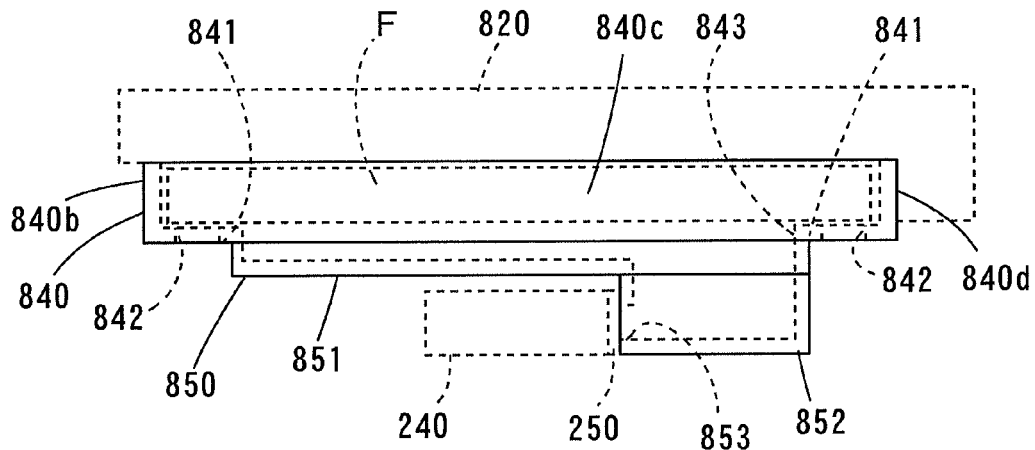
FIG. 9(a) is a side view of the filter storing member and the passage forming member of FIG. 8.
FIG. 9(b) is a plan view of the filter storing member and the passage forming member of FIG. 8 as viewed from a spin chuck.
Figure 9:
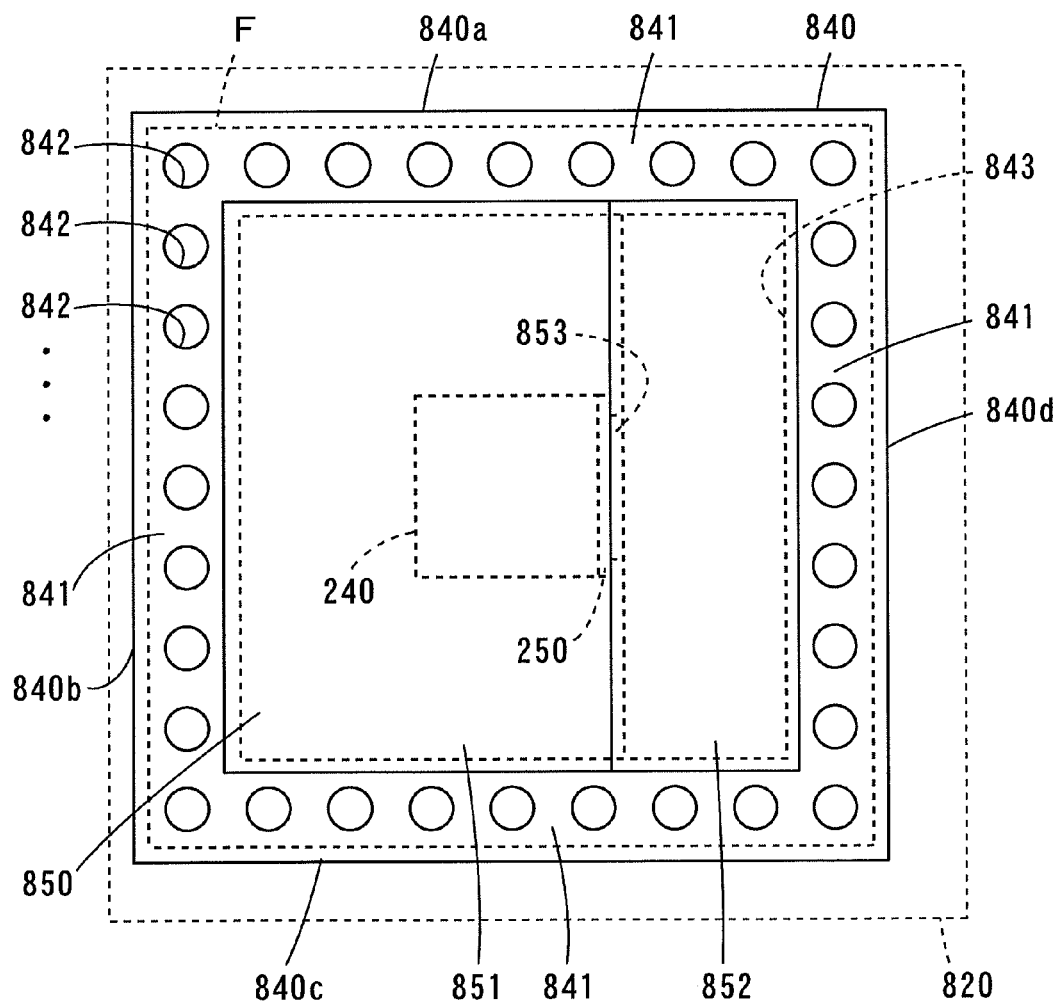

The details of the constituent elements for supplying air to the opening 520*h* of the spin plate 520 of FIG. 5 will be described. FIG. 8 is a vertical sectional view mainly showing the configuration of the rotating shaft 210, the base 220, the connection member 240, the duct 820, the filter storing member 840, and the passage forming member 850 of FIG. 5. FIG. 9(*a*) is a side view of the filter storing member 840 and the passage forming member 850 of FIG. 8, and FIG. 9(*b*) is a plan view of the filter storing member 840 and the passage forming member 850 viewed from the spin chuck 600 of FIG. 8.

As shown in FIG. 8, the duct 820 is attached to the ceiling 900*t* of the casing 900 of the back surface cleaning processing unit BC. The fan 810 provided inside of the casing 900 supplies the air outside of the substrate processing apparatus 500 (the air in the clean room, for example) to the duct 820. Note that the fan 810 may be provided outside of the casing 900.

A rectangular opening 821 is formed in the lower portion of the duct 820. In this example, the length of one side of the opening 821 is substantially equal to the diameter of the spin plate 520. Note that the length of the one side of the opening 821 may be larger than the diameter of the spin plate 520.

The filter storing member 840 is attached to the lower portion of the duct 820 so as to cover the opening 821 of the duct 820 from below. As shown in FIGS. 9(*a*) and 9(*b*), the filter storing member 840 has four side walls 840*a*, 840*b*, 840*c*, 840*d*. The side wall 840*a* and the side wall 840*c* are opposite to each other, and the side wall 840*b* and the side wall 840*d* are opposite to each other.

A rectangular frame 841 is formed so as to extend a predetermined distance from the lower ends of the four side walls 840*a* to 840*d* towards the inside of the filter storing member 840. A rectangular opening 843 is formed inside of the frame 841. The frame 841 has a plurality of through holes 842 formed at equal intervals so as to surround the opening 843. While each through hole 842 is circular-shaped in this example, each through hole 842 may be oval-shaped, triangle-shaped or square-shaped.

The rectangular ULPA filter F is stored inside of the filter storing member 840. The ULPA filter F has an outer shape that extends along an inner peripheral surface formed by the side walls 840*a* to 840*d* and has a substantially equal thickness to the height of the side walls 840*a* to 840*d*.

The passage forming member 850 with its upper end being opened is attached to the frame 841 of the filter storing member 840 so as to cover the opening 843 of the filter storing member 840 from below. The passage forming member 850 includes a passage restricting portion 851 and a passage portion 852. An air discharge port 853 is formed in the passage portion 852.

The base 220 is attached to the upper portion of the motor supporting member 200*s*. The connection member 240 is attached to the upper portion of the base 220. An air inlet port 241 and an air outlet port 242 are formed in the connection member 240. An inner space of the connection member 240 communicates with an inner space of the base 220 through the air outlet port 242.

The connection member 240 is configured to be connectable and disconnectable with the packing 250 sandwiched therebetween with respect to the passage forming member 850.

In the state where the air inlet port 241 of the connection member 240 and the air discharge port 853 of the passage forming member 850 are opposite to each other, the connection member 240 is connected to the passage forming member 850 with the packing 250 sandwiched therebetween.

Thus, the air passage is formed by the passage forming member 850, the connection member 240, the base 220, the motor supporting member 200*s* and the rotating shaft 210 of the spin motor 200.

As indicated by the thick solid line in FIG. 8, air is supplied to the duct 820. In this case, the air supplied to the duct 820 flows into the ULPA filter F stored in the filter storing member 840 from the opening 821.

Part of the clean air that has passed through the ULPA filter F flows into the passage forming member 850 from the opening 843 of the filter storing member 840. In this case, the passage restricting portion 851 leads the air to the passage portion 852 while preventing the flowing-in air from flowing downward. On the other hand, the passage portion 852 leads the air that is flowing in and the air that is led by the passage restricting portion 851 to the air discharge port 853.

Thus, the clean air that flows into the passage forming member 850 is supplied from the air discharge port 853 to the space below the spin plate 520 through the inner spaces of the connection member 240, the base 220, the motor supporting member 200s, the rotating shaft 210 and the plate supporting member 510, and the opening 520h formed in the spin plate 520.

The remaining clean air that has passed through the ULPA filter F is supplied from the plurality of through holes 842 in the filter storing member 840 towards the bottom surface 900b of the casing 900 of the back surface cleaning processing unit BC.

The fan 810 operates when the substrate processing apparatus 500 is turned on and stops when the substrate processing apparatus 500 is turned off. Therefore, in the back surface cleaning processing unit BC, when the substrate processing apparatus 500 is turned on, the clean air is constantly supplied downward from the opening 520h formed in the spin plate 520. Further, the clean air is constantly supplied downward from the plurality of through holes 842 formed in the filter storing member 840.

In the state where the substrate W is held by the spin chuck 600, a flow of clean air is formed between the substrate W and the spin plate 520. The opening area of the air discharge port 853 in the passage forming member 850 is smaller than the opening area of the opening 843 in the filter storing member 840 positioned upstream of the air discharge port 853. Further, the opening area of the air outlet port 242 in the connection member 240 is smaller than the opening area of the air discharge port 853 arranged upstream of the air outlet port 242 and substantially equal to the opening area of the through hole 200h in the motor supporting member 200s. Furthermore, the opening area in the rotating shaft 210 is smaller than the opening area of the through hole 200h in the motor supporting member 200s.

Thus, in this example, the air passage formed by the passage forming member 850, the connection member 240, the base 220, the motor supporting member 200s and the rotating shaft 210 of the spin motor 200 has a cross sectional area that gradually reduces from the ULPA filter F towards the opening 520h of the spin plate 520.

In this case, the velocity of air flow passing through the opening 520h of the spin plate 520 can be higher than the velocity of air flow passing through the ULPA filter F. Thus, a sufficient amount of air is supplied to a space between the substrate W and the spin plate 520 with the substrate W being held by the spin chuck 600. As a result, the flow of clean air flowing from the center of the substrate W to the outer peripheral edge of the substrate W is reliably formed on the upper surface of the substrate W.

As described above, the rectangular frame 841 is formed in the filter storing member 840. The air that flows in the ULPA filter F and then towards the frame 841 flows out to a space that is under the frame 841 the inside of the casing 900 from the plurality of through holes 842. In this case, the cross sectional area of the air flow passing through the ULPA filter F in the frame 841 becomes smaller. Therefore, the clean air is supplied to the space that is under the frame 841 the inside of the casing 900 at high velocity of air flow compared to the case where the frame 841 is not formed in the filter storing member 840. As a result, the air flow flowing from above towards below is reliably formed inside of the casing 900.

(5) Operation for Holding Substrate

Figure 10:
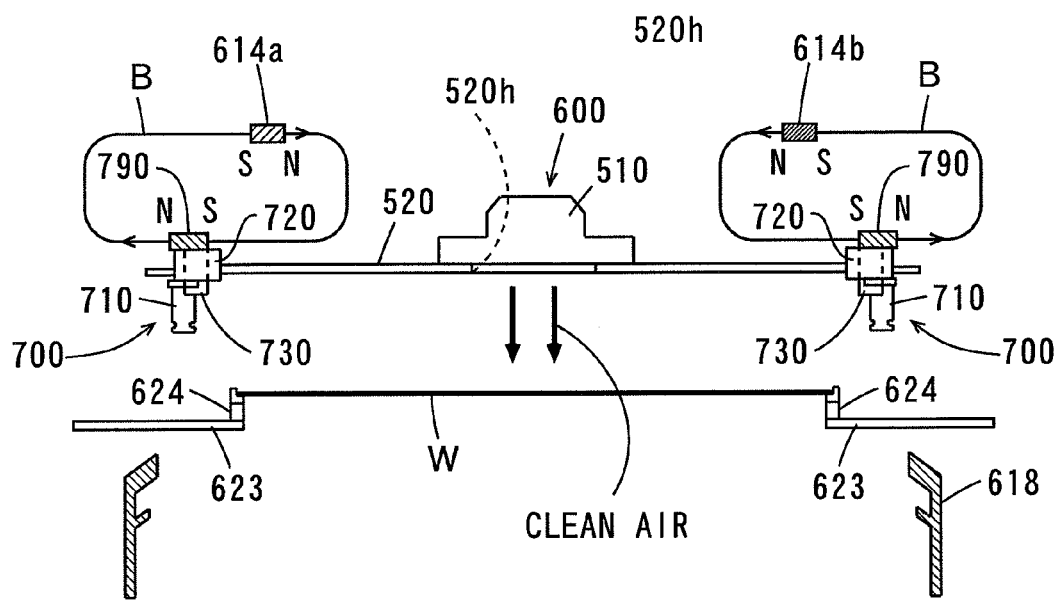
FIGS. 10(a) and 10(b) are diagrams for explaining an operation of holding a substrate by the spin chuck.
Figure 10:
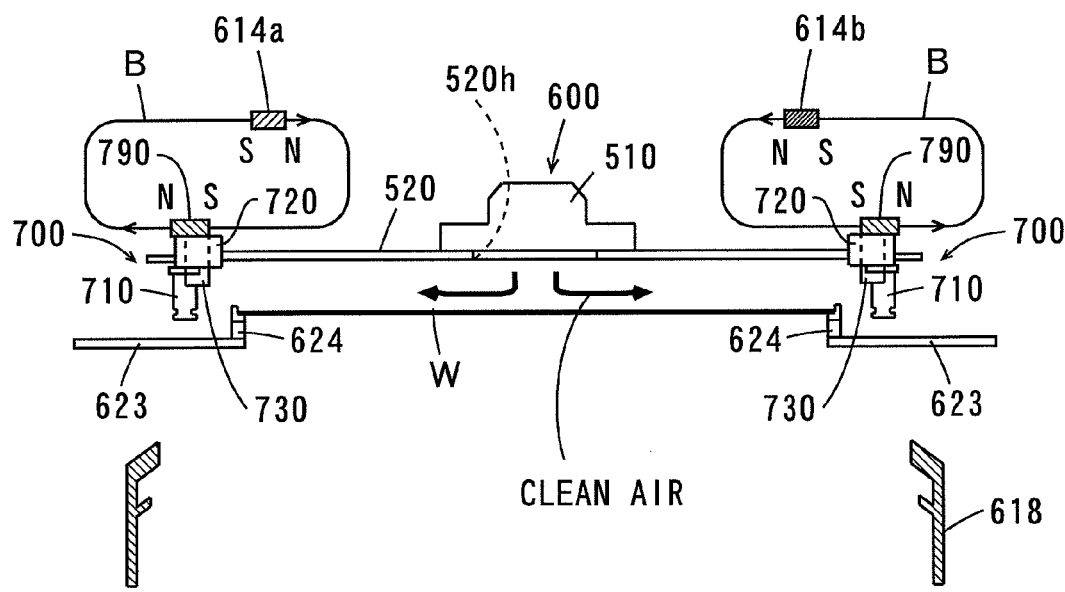
Figure 11:
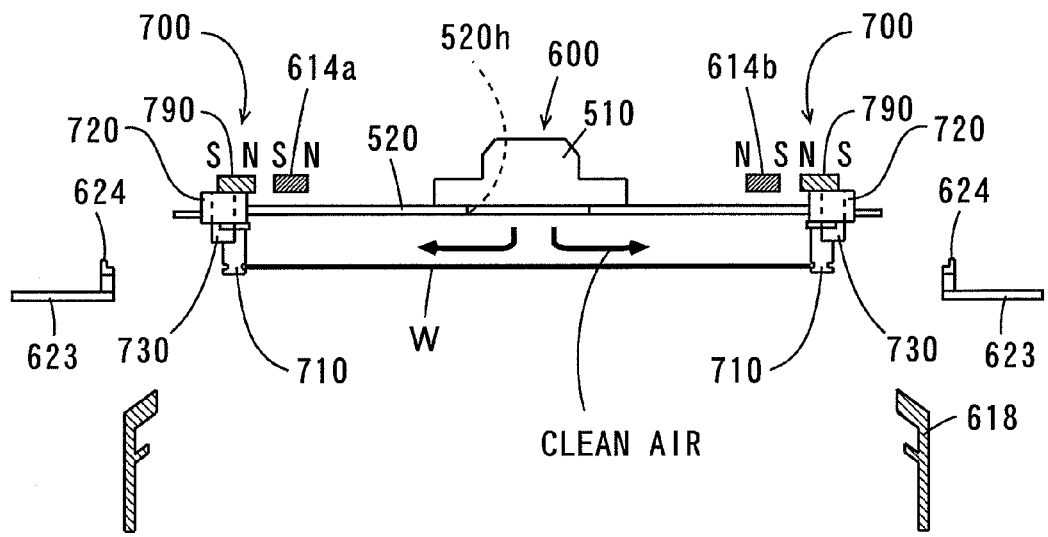
FIGS. 11(a) and 11(b) are diagrams for explaining the operation of holding the substrate by the spin chuck.
Figure 11:
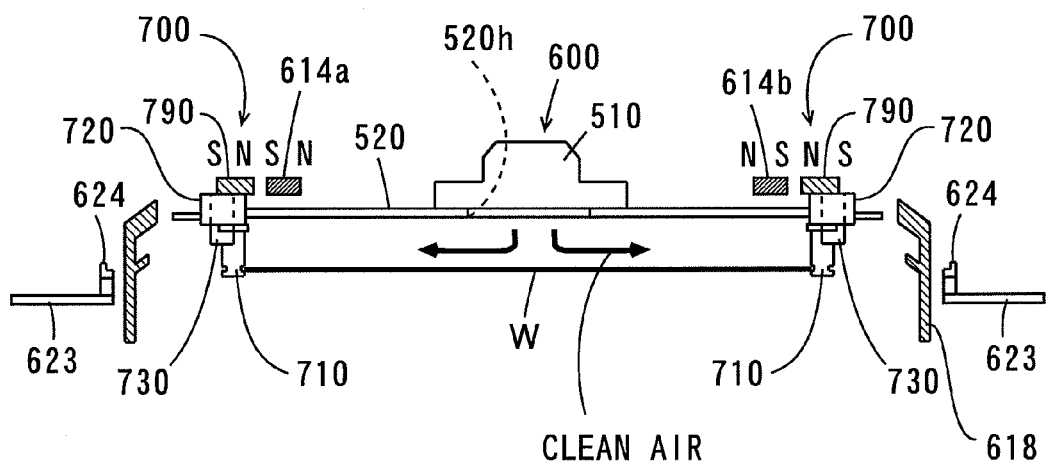

The operation for holding the substrate W by the spin chuck 600 will be described. FIGS. 10 and 11 are diagrams for explaining the operation for holding the substrate W by the spin chuck 600.

First, as shown in FIG. 10(a), the guard 618 moves to a position lower than the substrate holding mechanism 700. Then, the plurality of holding pins 624 of the plurality of substrate interface mechanisms 620 (FIG. 5) move to a position below the spin plate 520 through a position above the guard 618. The substrate W is placed on the plurality of holding pins 624 by the fourth central robot CR4 (FIG. 1).

At this time, the magnet plates 614a, 614b are at an upper position. In this case, a line of magnetic force B of the magnet plates 614a, 614b is directed outward from the inside at the height of the magnets 790 in the substrate holding mechanisms 700. Therefore, the S pole of the magnet 790 in each substrate holding mechanism 700 is sucked inward. This causes each substrate holding mechanism 700 to enter the opened state.

Then, the plurality of holding pins 624 rise with the substrate W held therein, as shown in FIG. 10(b). This causes the substrate W to move to a position among the holding pins 710 in a plurality of substrate holding mechanisms 700.

Then, as shown in FIG. 11(a), the magnet plates 614a, 614b move to a lower position. In this case, the N pole of the magnet 790 in each substrate holding mechanism 700 is sucked inward. This causes each substrate holding mechanism 700 to enter the closed state, causing the holding pin 710 in each substrate holding mechanism 700 to hold the outer peripheral edge of the substrate W. Note that each substrate holding mechanism 700 holds the outer peripheral edge of the substrate W between any two of the holding pins 624 that are adjacent to each other. Therefore, the substrate holding mechanisms 700 and the holding pins 624 do not interfere with each other. Thereafter, the plurality of holding pins 624 move outwardly from the guard 618.

Then, as shown in FIG. 11(b), the guard 618 moves to a height at which the substrate W held by the substrate holding mechanisms 700 is surrounded. Next, the substrate W is subjected to the back surface cleaning processing.

(6) Back Surface Cleaning Processing

Figure 12:
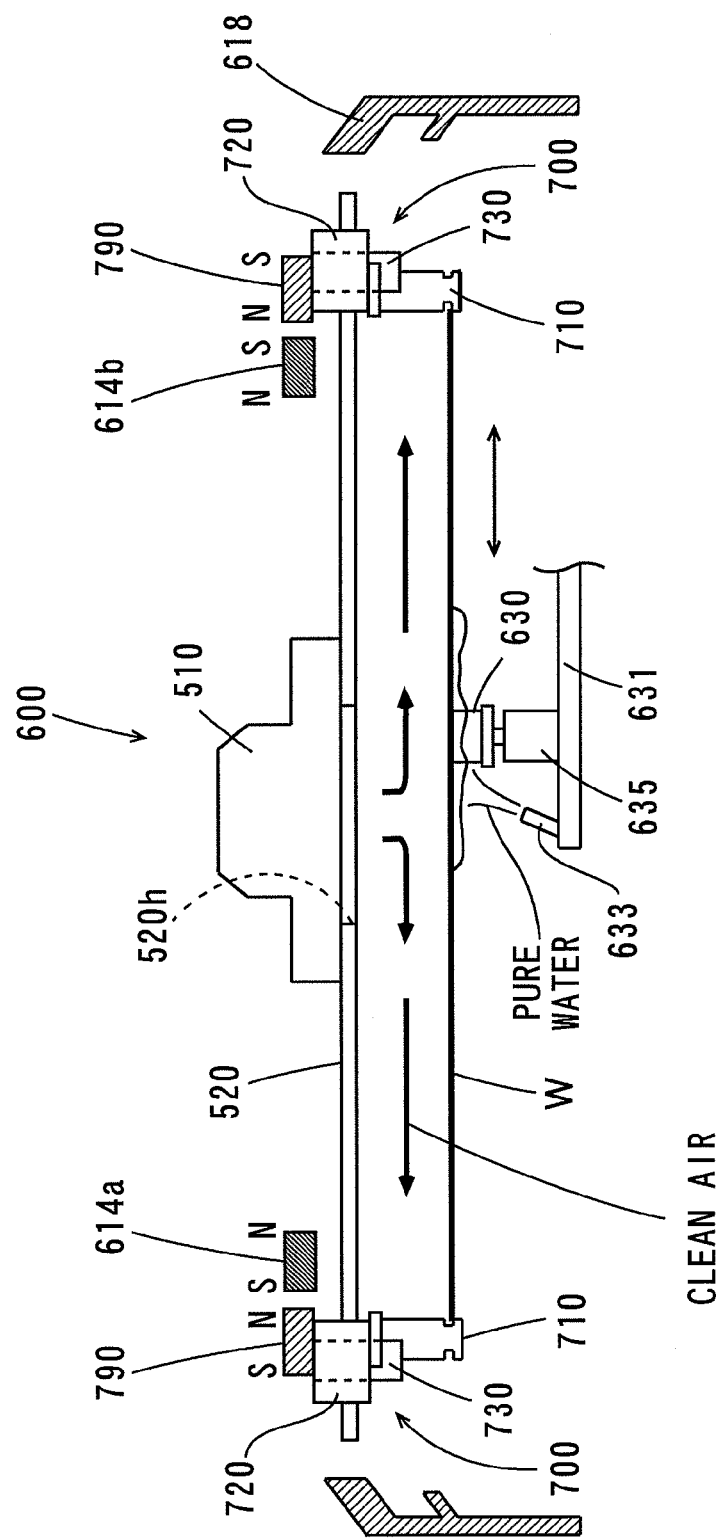
FIG. 12 is a side view for explaining back surface cleaning processing of the substrate.
Figure 13:
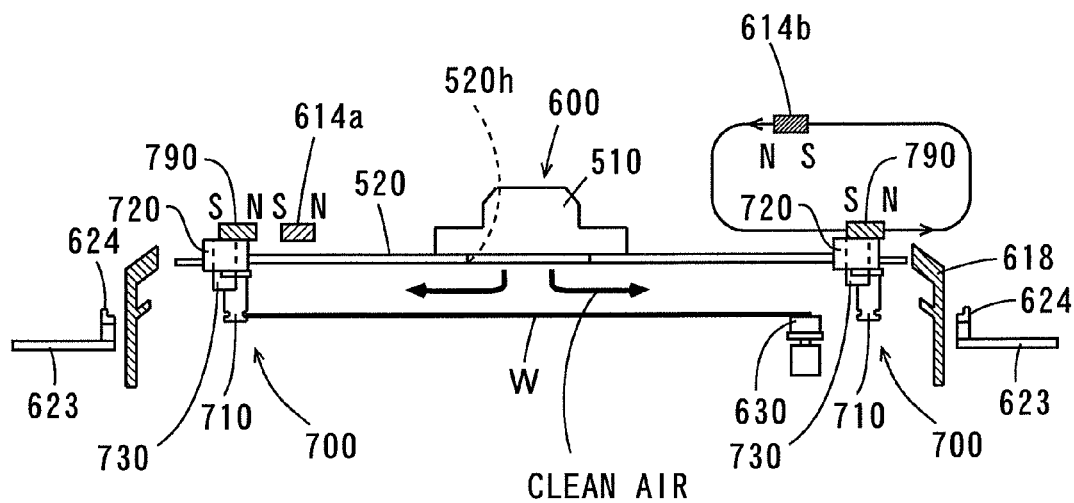
FIGS. 13(a) and 13(b) are side views for explaining the back surface cleaning processing of the substrate.
Figure 13:
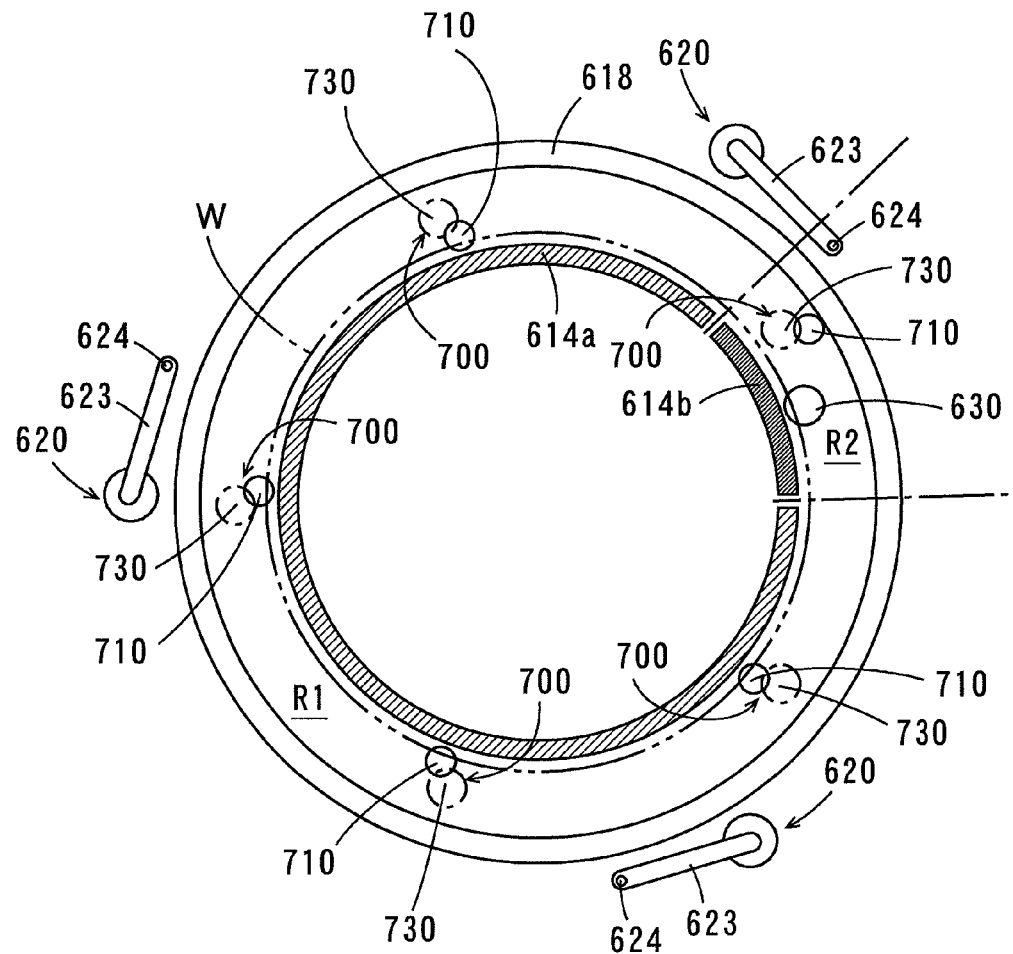

FIGS. 12 and 13 are side views for explaining the back surface cleaning processing of the substrate W.

As described above, when the substrate processing apparatus 500 is turned on, the clean air is constantly supplied downwardly from the opening 520h formed in the spin plate 520 in the back surface cleaning processing unit BC.

Therefore, as shown in FIG. 12, at the time of the back surface cleaning processing of the substrate, the spin chuck 600 causes the substrate W to rotate, and the clean air that has passed through the ULPA filter F is supplied to the space between the spin plate 520 and the substrate W through the opening 520h formed in the spin plate 520. Thus, the flow of clean air flowing from the center of the substrate W towards the outer peripheral edge of the substrate W is formed between the spin plate 520 and the substrate W.

In this state, the cleaning brush 630 comes in contact with the back surface of the substrate W. Then, the cleaning brush 630 moves between a position below the center of the substrate W and a position below the periphery thereof to come into contact with the entire back surface of the substrate W. Pure water is supplied from the cleaning nozzle 633 to a contact portion between the substrate W and the cleaning brush 630. Thus, the entire back surface of the substrate W is cleaned by the cleaning brush 633, and a contaminant that adheres to the back surface of the substrate is removed.

Next, as shown in FIG. 13(a), the magnet plate 614a is arranged at a lower position, and the magnet plate 614b is arranged at an upper position. In this case, as shown in FIGS. 13(a) and 13(b), each substrate holding mechanism 700 enters the closed state in a region R1 (FIG. 13(b)) outside of the magnet plate 614a, while the substrate holding mechanism 700 enters the opened state in a region R2 (FIG. 13(b)) outside of the magnet plate 614b. That is, the holding pin 710 in each substrate holding mechanism 700 is maintained in contact with the outer peripheral edge of the substrate W when passing through the region R1 outside of the magnet plate 614a, while the holding pin 710 is spaced apart from the outer peripheral edge of the substrate W when passing through the region R2 outside of the magnet plate 614b.

Therefore, in the region R2 outside of the magnet plate 614b, the lower surface portion of the outer peripheral edge of the substrate W can be cleaned by the cleaning brush 630.

Note that, at least four of the five substrate holding mechanisms 700 are positioned in the region R1 outside of the magnet plate 614a in this example. In this case, even if the holding pin 710 of each substrate holding mechanism 700 is spaced apart from the outer peripheral edge of the substrate W in passing through the region R2 outside of the magnet plate 614b, the substrate W is held by at least the four substrate holding mechanisms 700. Thus, the stability of the holding state of the substrate W is ensured.

After the completion of the back surface cleaning processing, the magnet plates 614a, 614b are arranged at a lower position and the substrate W is held by all of the substrate holding mechanisms 700. In this state, the spin chuck 600 causes the substrate W to rotate at high speed. This causes the pure water that adheres to the substrate W to be scattered, causing the substrate W to be dried.

(7) Effects of Embodiment (7-1) In the back surface cleaning processing unit BC according to the present embodiment, the fan 810 operates, causing the air outside of the substrate processing apparatus 500 to be supplied to the ULPA filter F through the duct 820. The clean air that has passed through the ULPA filter F is led to the opening 520h of the spin plate 520 through the passage forming member 850, the connection member 240, the base 220, the motor supporting member 200s and the rotating shaft 210 of the spin motor 200.

The spin chuck 600 holds the substrate W such that the upper surface of the substrate W is opposite to the spin plate 520. Thus, the clean air that is led to the opening 520h of the spin plate 520 is supplied towards the center of the substrate W held by the spin chuck 600. In this state, the spin motor 200 operates, causing the spin plate 520 to rotate, and causing the lower surface of the rotating substrate W to be cleaned by the cleaning brush 630.

In this case, the flow of clean air flowing from the center of the substrate W towards the outer peripheral edge of the substrate W is formed on the upper surface of the substrate W. Thus, an atmosphere including a mist (microdroplets) of the cleaning liquid or particles and the like are prevented from flowing into the space between the substrate W held by the spin chuck 600 and the spin plate 520. As a result, the lower surface of the substrate W can be cleaned while the upper surface of the substrate W is kept clean.

(7-2) Further, in the back surface cleaning processing unit BC described above, the clean air that has passed through the ULPA filter F is led to the opening 520h of the spin plate 520 through the inner space of the rotating shaft 210 of the spin motor 200. Thus, the rotating shaft 210 of the spin motor 200 forms part of the air passage, so that the clean air can be led to the opening 520h of the spin plate 520 without a complicated configuration.

(7-3) In the present embodiment, part of the clean air that has passed through the ULPA filter F flows into the passage forming member 850. Therefore, as described above, the clean air is supplied on the upper surface of the substrate W. On the other hand, the remaining clean air that has passed through the ULPA filter F is supplied towards the bottom surface 900b of the casing 900 of the back surface cleaning processing unit BC through the plurality of through holes 842 in the filter storing member 840. Therefore, the flow of clean air flowing from above towards below can be formed inside of the casing 900.

Thus, scattering of the mist of the cleaning liquid or the particles can be suppressed in the casing 900 while the upper surface of the substrate W is kept clean.

(7-4) Further, an inert gas such as an $N_2$ gas is not used, but the air that has passed through the ULPA filter F is used in the back surface cleaning processing unit BC, and therefore the upper surface of the substrate W is kept clean. Thus, an increase in the manufacturing cost of the substrate W is suppressed.

(7-5) As described above, the connection member 240 is configured to be connectable and disconnectable with the packing 250 sandwiched therebetween with respect to the passage forming member 850. Therefore, the spin chuck 600, the spin motor 200, the motor supporting member 200s, the base 220 and the connection member 240 can be easily taken out of the casing 900 by disconnecting the connection member 240 from the passage forming member 850. Thus, maintenance of the back surface cleaning processing unit BC can be easily performed.

(8) Modified Example (8-1) The back surface cleaning processing unit BC may be provided with a fluid supply pipe that passes through the through hole 200h in the motor supporting member 200s, the inside of the rotating shaft 210 in the spin motor 200, and the inside of the plate holding member 510. Further, a disc-shaped shield plate may be attached to the lower surface of the spin plate 520.

Figure 14:
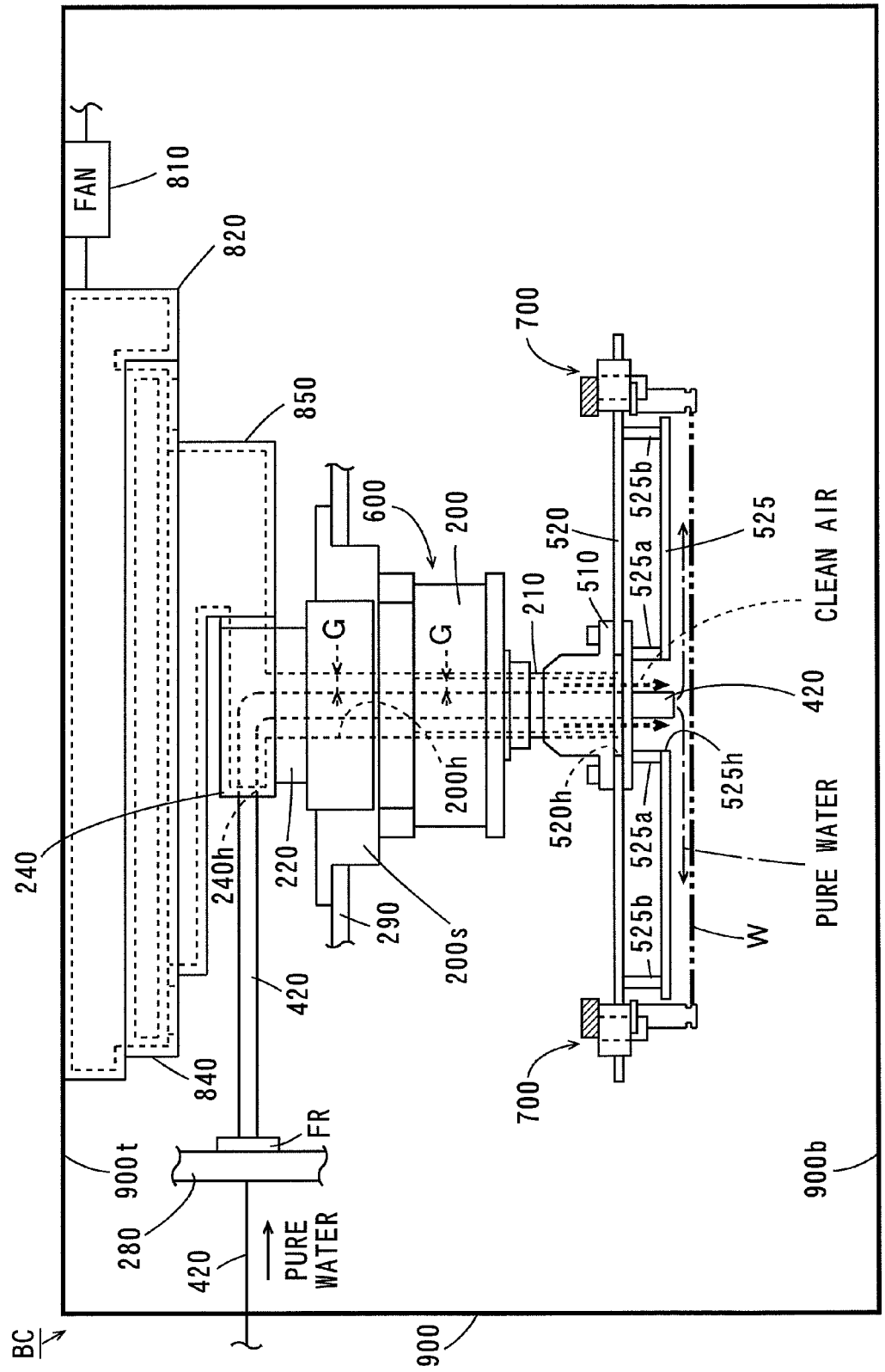
FIG. 14 is a side view showing another example of the configuration of the back surface cleaning processing unit.

FIG. 14 is a side view showing another example of the configuration of the back surface cleaning processing unit BC. As to the back surface cleaning processing unit BC of FIG. 14, the difference from the back surface cleaning processing unit BC of FIG. 5 will be described below. Note that only part of the constituent elements of the back surface cleaning processing unit BC is illustrated in FIG. 14, and the mechanism for cleaning the back surface of the substrate W, the guard lifting/lowering mechanism 618a, the substrate interface mechanism 620 and the like of FIG. 5 are not shown.

In the back surface cleaning processing unit BC, the fluid supply pipe 420 is provided so as to pass through the inside of the motor supporting member 200s, the rotating shaft 210 of the spin motor 200 and the inside of the plate holding member 510.

In this example, a hole 240h is formed on one side surface of the connection member 240 to allow the fluid supply pipe 420 to pass through the hole 240h. As shown in FIG. 14, the fluid supply pipe 420 is bent inside of the connection member 240 and extends in the horizontal direction through the hole 240h formed in the connection member 240. In the following description, the end of a straight portion, extending in the vertical direction, of the pipe is referred to as a downstream end, and the end of the straight portion, extending in the horizontal direction, of the pipe is referred to as an upstream end.

In the fluid supply pipe 420, a flange FR is integrally formed at the upstream end. The flange FR is fixed to a pipe fixing member 280. The pipe fixing member 280 is fixed to the casing 900 of the back surface cleaning processing unit BC. Thus, the fluid supply pipe 420 is fixed to the inside of the back surface cleaning processing unit BC. In this example, the fluid supply pipe 420 is used for supplying a cleaning liquid (pure water in this example) to the substrate W.

In addition to the configuration above, in the back surface cleaning processing unit BC of FIG. 14, a shield plate 525 is horizontally fixed to the lower surface of the spin plate 520 by fixing members 525a, 525b. Therefore, when the substrate W is held by the spin chuck 600, the upper surface of the substrate W is opposite to the shield plate 525. A through hole 525h is formed in the center portion of the shield plate 525. The spin motor 200 causes the rotating shaft 210 to rotate, causing the plate supporting member 510, the spin plate 520 and the shield plate 525 to integrally rotate around the vertical axis.

As shown in FIG. 14, the downstream end of the fluid supply pipe 420 is provided to project slightly downward from the through hole 525h of the shield plate 525. Thus, the pure water can be reliably supplied to the center portion of the upper surface of the substrate W.

A gap G is formed between the inner peripheral surface of the through hole 200h in the motor supporting member 200s and the outer peripheral surface of the fluid supply pipe 420. Similarly, the gap G is formed between the inner peripheral surface of the rotating shaft 210 and the outer peripheral surface of the fluid supply pipe 420.

Therefore, when the substrate processing apparatus 500 is turned on, the clean air is supplied towards the upper surface of the substrate W through those gaps G from an air supplying mechanism.

According to the back surface cleaning processing unit BC of this example, the main surface and the back surface of the substrate W can be cleaned simultaneously while the mist of the cleaning liquid and the particles are prevented from adhering to the substrate W.

While the pure water is supplied to the substrate W through the fluid supply pipe 420 in this example, the invention is not limited to this. An inert gas such as an $N_2$ gas may be supplied to the substrate W through the fluid supply pipe 420.

Further, in addition to the fluid supply pipe 420 that supplies the cleaning liquid to the substrate W, another fluid supply pipe that supplies the inert gas to the substrate W may be provided.

Figure 15:
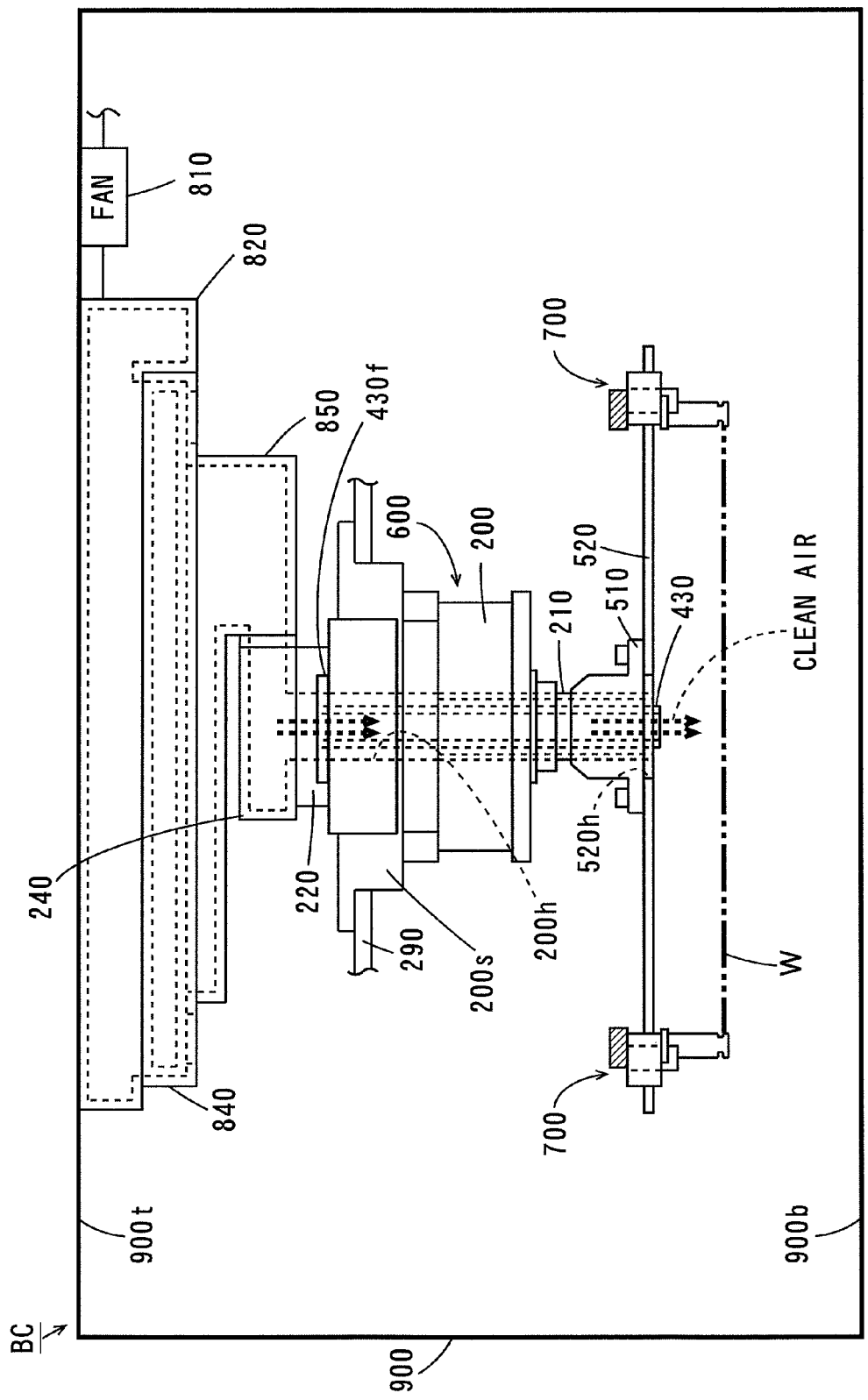
FIG. 15 is a side view showing yet another example of the configuration of the back surface cleaning processing unit.

(8-2) FIG. 15 is a side view showing yet another example of the configuration of the back surface cleaning processing unit BC. In the back surface cleaning processing unit BC of FIG. 15, a guide pipe 430 for leading the clean air to the space below the spin plate 520 is provided so that the clean air passes through the through hole 200h of the motor supporting member 200s, the inside of the rotating shaft 210 of the spin motor 200 and the inside of the plate supporting member 510.

The guide pipe 430 has a flange 430f at the upper end. The flange 430f of the guide pipe 430 is fixed to the upper surface of the motor supporting member 200s.

As shown in FIG. 15, the outer diameter of the guide pipe 430 is smaller than the inner diameter of the rotating shaft 210, and therefore a gap is formed between the outer peripheral surface of the guide pipe 430 and the inner peripheral surface of the rotating shaft 210.

In the back surface cleaning processing unit BC of this example, the clean air that flows downwardly from the base 220 on the upper side of the motor supporting member 200s flows into the space below the spin plate 520 through the inside of the guide pipe 430. Thus, the clean air does not come in contact with the rotating member (the rotating shaft 210 in this example), so that a reduction in the cleanliness of the air supplied onto the substrate W is prevented.

(8-3) In the back surface cleaning processing unit BC, the back surface and the outer peripheral edge of the substrate W do not necessarily have to be cleaned by the cleaning brush 630. In the back surface cleaning processing unit BC, the back surface cleaning processing may be performed by supplying the cleaning liquid to the entire back surface of the substrate W from the cleaning nozzle 633 without having the cleaning brush 630 to come in contact with the back surface of the substrate W.

Further, the back surface and the peripheral edge of the substrate W may be cleaned using a two-fluid nozzle that discharges a fluid mixture of a liquid and a gas. Further, the back surface and the outer peripheral edge of the substrate W may be cleaned using an ultrasonic nozzle containing a high-frequency vibrator. When the ultrasonic nozzle is used, the cleaning liquid in an ultrasonic vibration state is supplied to the back surface and the outer peripheral edge of the substrate W.

(8-4) The number of the back surface cleaning processing units BC, the coating units BARC, RES, the development processing units DEV, the heating units HP, the cooling units CP and the placement/cooling units PASS-CP may suitably be changed in accordance with the processing speed of each processing block.

(8-5) While the back surface cleaning processing units BC are arranged in the interface block 15 in the example described above, the back surface cleaning processing units BC may be arranged in the development processing block 12 of FIG. 1. Alternatively, the back surface cleaning processing block that includes the back surface cleaning processing units BC may be provided between the development processing block 12 and the interface block 15 of FIG. 1.

(8-6) In the exposure device 16 described above, the substrate W may be subjected to the exposure processing using an immersion method or another method. In these cases, processing defects due to the contamination on the main surface of the substrate W and the contamination on the back surface of the substrate W are prevented.

(8-7) While the back surface cleaning processing units BC clean the lower surface of the substrate W after the formation of the resist film and before the exposure processing by the exposure device 16 in the example described above, the invention is not limited to this. The back surface cleaning processing units BC may clean the lower surface of the substrate W after the formation of the resist film and after the exposure processing by the exposure device 16.

(8-8) The back surface cleaning processing unit BC can also be used as a chemical solution cleaning device that cleans the substrate using a chemical solution. The chemical solution is, e.g., an aqueous solution such as BHF (buffered hydrofluoric acid), DHF (dilute hydrofluoric acid), hydrofluoric acid, hydrochloric acid, sulfuric acid, nitric acid, phosphoric acid, acetic acid, oxalic acid, a hydrogen peroxide solution, or ammonia, or their mixed solutions. A rinse liquid is, e.g., pure water, carbonated water, ozone water, magnetic water, regenerated water (hydrogen water), or ionic water, or an organic solvent such as IPA (isopropyl alcohol).

(8-9) In the back surface processing unit BC, a motor may be attached to rotate the cleaning brush 630 around the vertical axis instead of the support shaft 635 that supports the cleaning brush 630. In this case, the lower surface of the substrate W can be cleaned by bringing the rotating cleaning brush 630 into contact with the lower surface of the substrate W at the time of the back surface cleaning processing of the substrate W.

(8-10) While the description was made of the case where the back surface cleaning processing units BC are provided in the substrate processing apparatus 500 in the example described above, the invention is not limited to this. The back surface cleaning processing units BC may be provided in another substrate processing apparatus, or alternatively, the back surface cleaning processing units BC may be used alone.

(9) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiments described above, the substrate W is an example of a substrate, the back surface cleaning processing unit BC is an example of a substrate cleaning apparatus, the spin plate 520 is an example of a rotating member, the opening 520h of the spin plate 520 is an example of an opening, the spin motor 200 is an example of a rotation-driving device, and the holding pins 710 of a plurality of the substrate holding mechanisms 700 are examples of a holding member.

Further, the configuration including the fan 810, the duct 820, the passage forming member 850, the connection member 240, the base 220, the motor supporting member 200s and the rotating shaft 210 of the spin motor 200, or the configuration including the fan 810, the duct 820, the passage forming member 850, the connection member 240, the base 220 and the guide pipe 430 is an example of an air supplying mechanism.

Further, the configuration including the cleaning brush 630, the brush holding member 631, the brush moving mechanism 632, the cleaning nozzle 633 and the support shaft 635 is an example of a cleaning mechanism, the ULPA filter F is an example of a filter, and the fan 810 and the duct 820 are examples of an air supplier.

Further, the configuration including the passage forming member 850, the connection member 240, the base 220, the motor supporting member 200s and the rotating shaft 210 of the spin motor 200, or the configuration including the passage forming member 850, the connection member 240, the base 220 and the guide pipe 430 are examples of an air passage.

Further, the casing 900 is an example of a casing, the duct 820 is an example of a duct, the rotating shaft 210 is an example of a rotating shaft, the cleaning brush 630 is an example of a cleaning member, the cleaning nozzle 633 is an example of a cleaning liquid supplier.

Furthermore, the exposure device 16 is an example of an exposure device, the substrate processing apparatus 500 is an example of a substrate processing apparatus, the anti-reflection film processing block 10, the resist film processing block 11 and the development processing block 12 are examples of a processing section, and the interface block 15 is an example of an interface section, the resist film is an example of a photosensitive film, the coating unit RES of the resist film processing block 11 is an example of a photosensitive film formation unit.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate cleaning apparatus that cleans a lower surface of a substrate, comprising:
   a rotating member that is provided to be rotatable around a rotation axis extending in a vertical direction and has an opening at the center thereof;
   a rotation-driving device that is provided on an upper side of said rotating member to rotate said rotating member;
   a holding member that is provided on a lower side of said rotating member to hold the substrate with an upper surface of the substrate being opposite to said rotating member;
   an air supplying mechanism that supplies air to a space between the substrate held by said holding member and said rotating member through the opening of said rotating member; and
   a cleaning mechanism that cleans the lower surface of the substrate held by said holding member, wherein
   said air supplying mechanism includes
   a filter,
   an air supplier that supplies air to said filter, and
   an air passage configured to lead the air that has passed through said filter to the opening of said rotating member,
   said air passage being configured to have a cross sectional area reducing gradually from said filter to said opening of said rotating member, and
   said air passage further includes
   a filter storing member that has a first outlet port and is configured to store said filter and allow the air supplied by said air supplier to flow out from the first outlet port through the inside of said stored filter,
   a passage forming member that has a second outlet port having an opening area smaller than the first outlet port and that is connected to said filter storing member to receive the air that has flowed out from the first outlet port and is configured to lead the air that has flowed out from the first outlet port to the second outlet port, and
   a connection member that has a third outlet port having an opening area smaller than the second outlet port and is configured to receive the air that has flowed out from the second outlet port and lead the air that has flowed out from the second outlet port to the third outlet port,
   said connection member being configured to be connectable to and detachable from said passage forming member.

2. The substrate cleaning apparatus according to claim 1, further comprising a casing that stores at least part of said air supplying mechanism, said rotating member, said rotation-driving device, said holding member and said cleaning mechanism, wherein said filter is arranged at an upper portion in said casing so as to allow the passage of the air supplied by said air supplier from above towards below, said air passage is configured to lead part of the air that has passed through said filter to the opening of said rotating member, and remaining air that has passed through said filter is supplied into said casing.

3. The substrate cleaning apparatus according to claim 2, wherein said air supplier includes a duct that is provided on an upper side of said filter to lead the air supplied from outside of said casing to said filter.

4. The substrate cleaning apparatus according to claim 1, wherein said rotation-driving device has a hollow rotating shaft that constitutes part of said air passage and extends in a vertical direction, and said rotating member is attached to a lower end of said rotating shaft such that an inner space of said rotating shaft communicates with the space below said rotating member through said opening.

5. The substrate cleaning apparatus according to claim 1, wherein said cleaning mechanism includes a cleaning member for cleaning the lower surface of the substrate held by said holding member, and a cleaning liquid supplier that supplies a cleaning liquid to the lower surface of the substrate held by said holding member.

6. A substrate processing apparatus that is arranged adjacent to an exposure device and subjects a substrate to processing, comprising:

a processing section for performing the processing on the substrate; and an interface section for receiving and transferring the substrate between said processing section and said exposure device, wherein at least one of said processing section and said interface section includes the substrate cleaning apparatus according to claim 1 that cleans a lower surface of the substrate before exposure processing by said exposure device.

7. The substrate processing apparatus according to claim 6, wherein said processing section includes a photosensitive film formation unit configured to form a photosensitive film made of a photosensitive material on an upper surface of the substrate, and said substrate cleaning apparatus is configured to clean the lower surface of the substrate after the formation of the photosensitive film by said photosensitive film formation unit and before or after the exposure processing by said exposure device.

* * * * *